(12) United States Patent
Cheng et al.

(10) Patent No.: US 12,279,452 B2
(45) Date of Patent: Apr. 15, 2025

(54) STACKED COMPLEMENTARY TRANSISTOR STRUCTURE FOR THREE-DIMENSIONAL INTEGRATION

(71) Applicant: International Business Machines Corporation, Armonk, NY (US)

(72) Inventors: Kangguo Cheng, Schenectady, NY (US); Shogo Mochizuki, Mechanicville, NY (US); Juntao Li, Cohoes, NY (US)

(73) Assignee: International Business Machines Corporation, Armonk, NY (US)

( * ) Notice: Subject to any disclaimer, the term of this patent is extended or adjusted under 35 U.S.C. 154(b) by 606 days.

(21) Appl. No.: 17/551,309

(22) Filed: Dec. 15, 2021

(65) Prior Publication Data

US 2023/0187551 A1    Jun. 15, 2023

(51) Int. Cl.
*H10D 30/69*     (2025.01)
*H01L 23/528*     (2006.01)
(Continued)

(52) U.S. Cl.
CPC ....... *H10D 30/797* (2025.01); *H01L 23/5286* (2013.01); *H10D 30/031* (2025.01);
(Continued)

(58) Field of Classification Search
CPC ................. H01L 27/092; H01L 29/401; H01L 29/41733; H01L 29/41775; H01L 29/42392; H01L 29/66742; H01L 29/7848; H01L 29/78618; H01L 29/78696; H10D 30/6713; H10D 30/6735; H10D 30/797;
(Continued)

(56) References Cited

U.S. PATENT DOCUMENTS 9,659,963 B2    5/2017   Cheng et al.
10,573,655 B2    2/2020   Smith et al.
(Continued)

FOREIGN PATENT DOCUMENTS

WO   PCT/IB2022/061660       2/2023

OTHER PUBLICATIONS

C.-Y. Huang et al., "3-D Self-Aligned Stacked NMOS-on-PMOS Nanoribbon Transistors for Continued Moore's Law Scaling." IEEE International Electron Devices Meeting (IEDM), 2020, pp. 20.6.1-20.6.4.

(Continued)

*Primary Examiner* — Fazli Erdem
(74) *Attorney, Agent, or Firm* — Samuel Waldbaum; Ryan, Mason & Lewis, LLP

(57) ABSTRACT

A device comprises a first interconnect structure, a second interconnect structure, a stacked complementary transistor structure, a first contact, and a second contact. The stacked complementary transistor structure is disposed between the first and second interconnect structures. The stacked complementary transistor structure comprises a first transistor of a first type, and a second transistor of a second type which is opposite the first type. The first contact connects a first source/drain element of the first transistor to the first interconnect structure. The second contact connects a first source/drain element of the second transistor to the second interconnect structure. The first and second contacts are disposed in alignment with each other.

20 Claims, 23 Drawing Sheets

(51) Int. Cl.
  *H10D 30/01*   (2025.01)
  *H10D 30/67*   (2025.01)
  *H10D 64/01*   (2025.01)
  *H10D 64/23*   (2025.01)
  *H10D 84/01*   (2025.01)
  *H10D 84/03*   (2025.01)
  *H10D 84/85*   (2025.01)

(52) U.S. Cl.
  CPC ..... *H10D 30/6713* (2025.01); *H10D 30/6729* (2025.01); *H10D 30/6735* (2025.01); *H10D 30/6757* (2025.01); *H10D 64/01* (2025.01); *H10D 64/258* (2025.01); *H10D 84/0167* (2025.01); *H10D 84/017* (2025.01); *H10D 84/0172* (2025.01); *H10D 84/0186* (2025.01); *H10D 84/038* (2025.01); *H10D 84/85* (2025.01)

(58) Field of Classification Search
  CPC .. H10D 64/257; H10D 64/258; H10D 84/017; H10D 84/0172; H10D 84/0186
  USPC ........................................................ 257/369
  See application file for complete search history.

(56) References Cited

U.S. PATENT DOCUMENTS

| | | |
|---|---|---|
| 11,043,493 B2 | 6/2021 | Bi et al. |
| 2016/0148933 A1* | 5/2016 | Cheng ................... H01L 21/266 257/369 |
| 2019/0131396 A1 | 5/2019 | Zhang et al. |
| 2020/0152508 A1 | 5/2020 | Jourdain et al. |
| 2020/0211905 A1 | 7/2020 | Huang et al. |
| 2020/0266169 A1 | 8/2020 | Kang et al. |
| 2020/0402984 A1 | 12/2020 | Reznicek et al. |
| 2021/0035975 A1 | 2/2021 | Kim et al. |
| 2021/0098306 A1 | 4/2021 | Smith et al. |
| 2021/0118798 A1 | 4/2021 | Liebmann et al. |
| 2021/0202500 A1 | 7/2021 | Chanemougame et al. |
| 2021/0296315 A1 | 9/2021 | Lilak et al. |
| 2021/0407999 A1* | 12/2021 | Huang ................ H01L 27/0688 |
| 2022/0199771 A1* | 6/2022 | Chouksey ....... H01L 21/823475 |
| 2022/0231013 A1* | 7/2022 | Hong ................... H01L 27/088 |

OTHER PUBLICATIONS

W. Rachmady et al., "300mm Heterogeneous 3D Integration of Record Performance Layer Transfer Germanium PMOS with Silicon NMOS for Low Power High Performance Logic Applications," International Electron Devices Meeting (IEDM), 2019, pp. 29.7.1-29.7.4. J. Ryckaert et al., "The Complementary FET (CFET) for CMOS scaling beyond N3," Symposium on VLSI Technology, 2018, pp. 141-142.

* cited by examiner

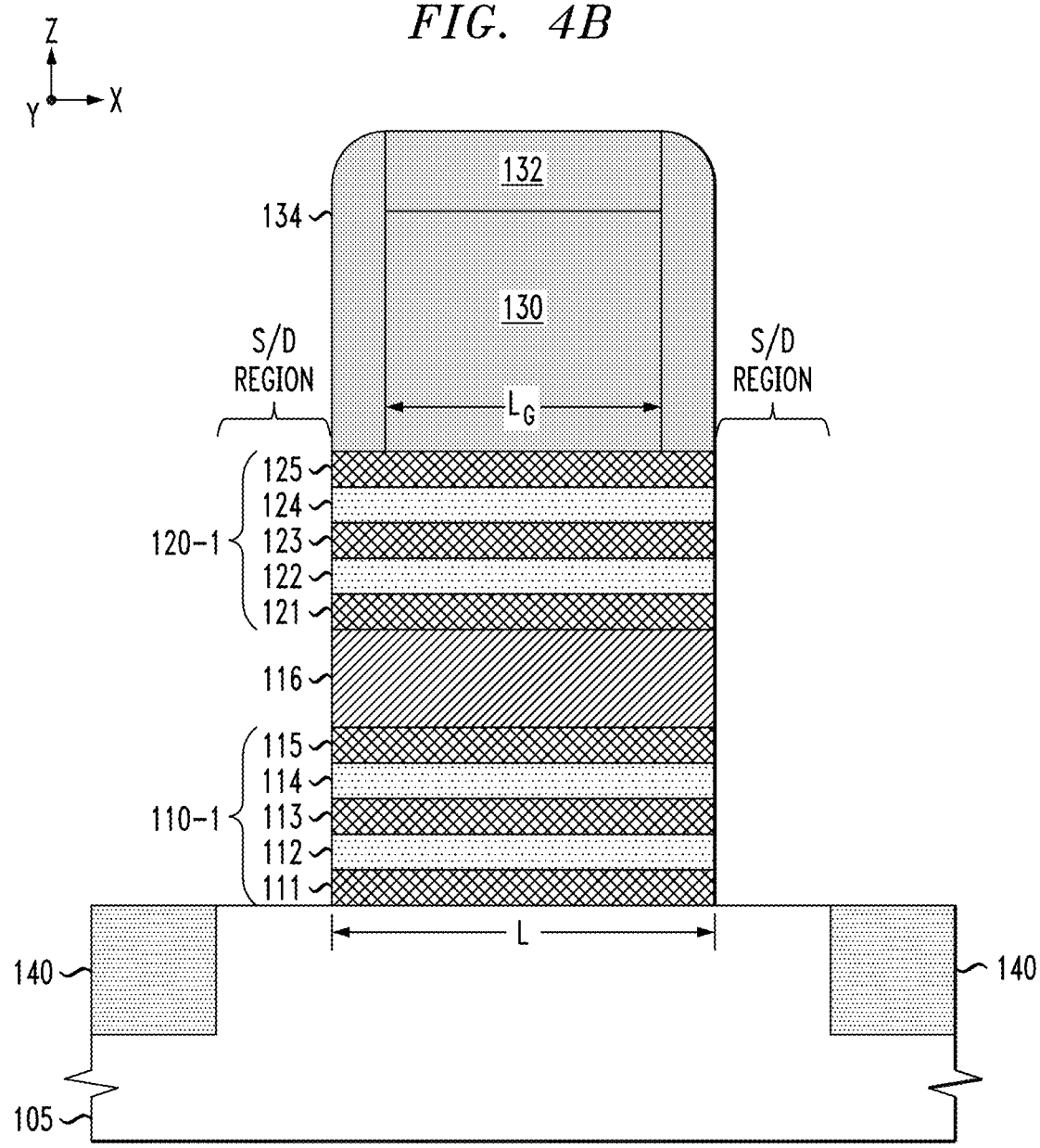

STACKED COMPLEMENTARY TRANSISTOR STRUCTURE FOR THREE-DIMENSIONAL INTEGRATION

BACKGROUND

This disclosure relates generally to monolithic three-dimensional (3-D) integration techniques and, in particular, techniques for fabricating monolithic 3-D semiconductor integrated circuit devices comprising stacked CMOS (complementary metal-oxide semiconductor) transistor structures. Continued innovations in semiconductor process technologies are enabling higher integration densities and device scaling. In particular, state-of-the-art 3D integration technologies are poised to become critical technology boosters for providing extremely dense integrated circuits. A 3-D monolithic design comprises stacked layers of field-effect transistor (FET) devices to reduce a device footprint. For example, a FET-over-FET integration scheme is one form of a 3-D monolithic integration scheme in which p-type FET (PFET) and n-type FET (NFET) devices are formed in different device layers on a single substrate.

While stacked CMOS structures allow for increased transistor density by stacking PFET devices and NFET devices on top of each other, the integration density of stacked CMOS structures is limited by, e.g., the spacing needed for source/drain contacts. In particular, for 3-D semiconductor integrated circuit devices in which the source/drain elements of the stacked CMOS structure are connected to a back-end-of-line (BEOL) interconnect structure disposed over the stacked CMOS structure, at least one lower source/drain region of a lower FET device must be formed to laterally extend past an upper source/drain region of a corresponding upper FET device to provide the lateral spacing needed to form a source/drain contact from the lower source/drain region to the BEOL interconnect structure. This extra lateral spacing needed for the source/drain contacts increases a cell size of the stacked CMOS structure, which is undesired.

Furthermore, another issue with stacked CMOS technology is the ability to effectively isolate the stacked NFET/PFET structure from an underlying semiconductor substrate. For example, with insufficient isolation, device performance will degrade as a result of increased source/drain leakage to the underlying substrate and increased parasitic capacitance and leakage between a metal gate structure and the underlying substrate. While conventional isolation techniques can be utilized to form structures/layers to isolate the stacked NFET/PFET structure from an underlying semiconductor substrate, such techniques require dedicated process modules to form such isolation structure and/or layers, which provide added complexity and cost to the semiconductor fabrication process.

SUMMARY

Exemplary embodiments will now be described in further detail with regard semiconductor integrated circuit devices comprising stacked complementary transistor structures, and methods for fabricating such semiconductor integrated circuit devices.

An exemplary embodiment includes a device which comprises a first interconnect structure, a second interconnect structure, a stacked complementary transistor structure, a first contact, and a second contact. The stacked complementary transistor structure is disposed between the first and second interconnect structures. The stacked complementary transistor structure comprises a first transistor of a first type, and a second transistor of a second type which is opposite the first type. The first contact connects a first source/drain element of the first transistor to the first interconnect structure. The second contact connects a first source/drain element of the second transistor to the second interconnect structure. The first and second contacts are disposed in alignment with each other.

Advantageously, the implementation of the second interconnect structure and the connection of the second contact to the second interconnect structure allows for a reduction in the cell size of the stacked complementary transistor structure since the first and second contacts can be formed in longitudinal alignment with each other. This eliminates the need to connect both the first and second contacts to the same interconnect structure (e.g., the first interconnect structure), which would require the first and second contacts to be disposed adjacent to each other, which would require additional lateral spacing, and thus increase the cell size of the stacked complementary transistor structure.

Another exemplary embodiment includes a device which comprises a first interconnect structure, a second interconnect structure, a stacked complementary transistor structure, an insulating layer, a first contact, and a second contact. The stacked complementary transistor structure is disposed between the first and second interconnect structures. The stacked complementary transistor structure comprises a first transistor of a first type, and a second transistor of a second type which is opposite the first type. The insulating layer is disposed between the stacked complementary transistor structure and the second interconnect structure, wherein first and second source/drain elements of the second transistor each comprise an extended portion which extends into the second insulating layer. The first contact connects a first source/drain element of the first transistor to the first interconnect structure. The second contact is coupled to the extended portion of the first source/drain element of the second transistor to connect the first source/drain element of the second transistor to the second interconnect structure. The first and second contacts are disposed in alignment with each other.

Advantageously, the implementation of the extended portions of the first and second source/drain elements of the second transistor allows the first and second source/drain elements to apply strain (e.g., compressive strain, or tensile strain) to an active channel of the second transistor at some point in time during fabrication of the device in which the extended portions are released from a semiconductor substrate before being disposed in the second insulating layer.

Another embodiment includes a device which comprises a first interconnect structure, a second interconnect structure, a complementary inverter, a first contact, a second contact, and a third contact. The complementary inverter comprises a stacked complementary transistor structure disposed between the first and second interconnect structures. The stacked complementary transistor structure comprises a first transistor of a first type, and a second transistor of a second type which is opposite the first type. The first transistor comprises a source element, and a drain element, and the second transistor comprises a source element, and a drain element. The first contact commonly connects the drain elements of the first and second transistors to the first interconnect structure. The second contact connects the source element of the first transistor to the first interconnect structure. The third contact connects the source element of the second transistor to the second interconnect structure. The second and third contacts are disposed in alignment with each other.

Another embodiment includes a method for fabricating a semiconductor device. A stacked complementary transistor structure is formed on a semiconductor substrate. The stacked complementary transistor structure comprises a first transistor of a first type, and a second transistor of a second type which is opposite the first type. A first contact is formed which is connected to a first source/drain element of the first transistor. A first interconnect structure is formed which is connected to the first contact. A portion of the semiconductor substrate is removed to expose a bottom surface of the stacked complementary transistor structure. An insulating layer is formed which covers the exposed bottom surface of the stacked complementary transistor structure. A second contact is formed in the insulating layer, which is connected to a first source/drain element of the second transistor, wherein the second contact is formed in alignment with the first contact. A second interconnect structure is formed on the insulating layer, wherein the second interconnect structure is connected to the second contact.

Advantageously, the process of replacing the removed portion of the semiconductor substrate with the insulating layer to cover the exposed bottom surface of the stacked complementary transistor structure and the first and second source/drain elements of the second transistor serves to provide isolation from the semiconductor substrate without the need to implement a dedicated process module to achieve such isolation.

Another embodiment includes a method for fabricating a semiconductor device. A stacked complementary transistor structure is formed on a semiconductor substrate. The stacked complementary transistor structure comprises a first transistor of a first type, and a second transistor of a second type which is opposite the first type. The first transistor comprises a first source/drain element, and a second source/drain element. The second transistor comprises a first source/drain element, and a second source/drain element, wherein the first and second source/drain elements of the second transistor each comprise an extended portion which extends into the semiconductor substrate. A first contact is formed which is connected to a first source/drain element of the first transistor. A first interconnect structure is formed which is connected to the first contact. A portion of the semiconductor substrate is removed to expose a bottom surface of the stacked complementary transistor structure and to release the extended portions of the first and second source/drain elements of the second transistor. An insulating layer is formed which covers the exposed bottom surface of the stacked complementary transistor structure and the extended portions of the first and second source/drain elements of the second transistor. A second contact is formed in the insulating layer in contact with the extended portion of the first source/drain element of the second transistor, wherein the second contact is formed in alignment with the first contact. A second interconnect structure is formed on the insulating layer, wherein the second interconnect structure is connected to the second contact.

Advantageously, releasing the extended portions of the first and second source/drain elements of the second transistor by removal of the portion of the semiconductor substrate allows the first and second source/drain elements to apply strain (e.g., compressive strain, or tensile strain) to an active channel of the second transistor, before the second insulating layer is formed. The strain enhances performance of the second transistor and the stacked complementary transistor structure.

Other embodiments will be described in the following detailed description of embodiments, which is to be read in conjunction with the accompanying figures.

BRIEF DESCRIPTION OF THE DRAWINGS

FIGS. 2-17 schematically illustrate a method for fabricating a semiconductor integrated circuit device comprising a stacked complementary transistor structure comprising first and second transistors, according to an embodiment of the invention, wherein:

FIG. 2 is a schematic cross-sectional side view of an initial structure of the semiconductor integrated circuit device at an initial stage of fabrication comprising a semiconductor substrate, and a nanosheet stack structure formed on the semiconductor substrate;

FIGS. 4A, 4B, and 4C are schematic views of a next intermediate structure of the semiconductor integrated circuit device, which is constructed by forming a dummy gate structure which overlaps a portion of the patterned nanosheet stack structure of FIGS. 3A-3C, and patterning exposed portions of the patterned nanosheet stack structure in the source/drain regions adjacent to the dummy gate structure to form respective first and second nanosheet channel structures of the first and second transistors, according to an exemplary embodiment of the disclosure;

FIG. 5 is a schematic cross-sectional side view of a next intermediate structure of the semiconductor integrated circuit device structure, which is constructed by replacing a remaining portion of the sacrificial nanosheet layer with a dielectric isolation layer that isolates the stacked first and second transistors, according to an exemplary embodiment of the disclosure;

FIG. 6 is a schematic cross-sectional side view of a next intermediate structure of the semiconductor integrated circuit device, which is constructed by laterally recessing exposed sidewall surfaces of the sacrificial nanosheet layers of the first and second nanosheet channel structures in FIG. 5 to thereby form recesses in the sidewalls of the first and second nanosheet channel structures, according to an exemplary embodiment of the disclosure;

FIG. 7 is a schematic cross-sectional side view of a next intermediate structure of the semiconductor integrated circuit device, which is constructed by forming the embedded gate sidewall spacers within the recesses in the sidewalls of the of the first and second nanosheet channel structures, according to an exemplary embodiment of the disclosure;

FIG. 8 is a schematic cross-sectional side view of a next intermediate structure of the semiconductor integrated circuit device, which is constructed by recessing exposed portions of the semiconductor substrate in source/drain regions to form first and second trenches in the semiconductor substrate, according to an exemplary embodiment of the disclosure;

FIG. 9 is a schematic cross-sectional side view of a next intermediate structure of the semiconductor integrated circuit device, which is constructed by epitaxially growing first and second source/drain elements of the first transistor starting from bottom surfaces of the first and second trenches in the semiconductor substrate, according to an exemplary embodiment of the disclosure;

FIG. 10 is a schematic cross-sectional side view of a next intermediate structure of the semiconductor integrated circuit device, which is constructed by depositing and patterning a conformal layer of dielectric material to form a protective liner over the first and second source/drain elements of the first transistor, according to an exemplary embodiment of the disclosure;

FIG. 11 is a schematic cross-sectional side view of a next intermediate structure of the semiconductor integrated circuit device, which is constructed by epitaxially growing first and second source/drain elements of the second transistor, and forming a first insulating layer to encapsulate the stacked complementary transistor structure, according to an exemplary embodiment of the disclosure;

FIG. 14 is a schematic cross-sectional side view of a next intermediate structure of the semiconductor integrated circuit device, which is constructed by forming gate and source/drain contacts to the stacked FET structure, according to an exemplary embodiment of the disclosure;

FIG. 15 is a schematic cross-sectional side view of a next intermediate structure of the semiconductor integrated circuit device, which is constructed by forming a first interconnect structure on a frontside of the intermediate structure of FIG. 14, and bonding a handler substrate to the first interconnect structure, according to an exemplary embodiment of the disclosure;

FIG. 16 is a schematic cross-sectional side view of a next intermediate structure of the semiconductor integrated circuit device, which is constructed by backside processing the intermediate structure of FIG. 14 to remove a portion of the semiconductor substrate, according to an exemplary embodiment of the disclosure; and FIG. 17 is a schematic cross-sectional side view of a next intermediate structure of the semiconductor integrated circuit device, which is constructed by backside processing the intermediate structure of FIG. 16 to form a dielectric layer, backside contacts, and a backside interconnect structure, according to an exemplary embodiment of the disclosure.

DETAILED DESCRIPTION

Figure 1:
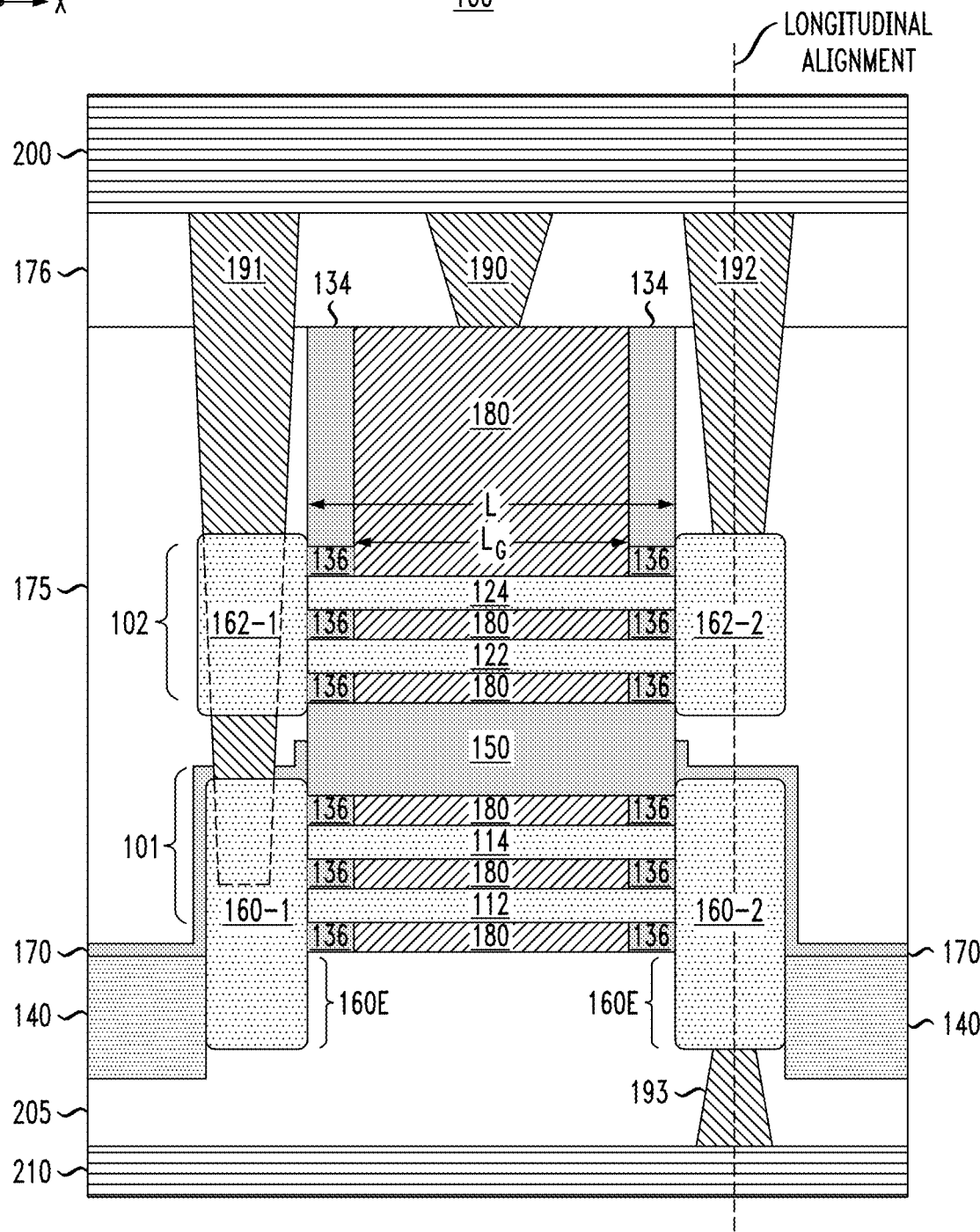
FIG. 1 is schematic cross-sectional side view of a semiconductor integrated circuit device comprising a stacked complementary transistor structure, according to an exemplary embodiment of the disclosure.

Exemplary embodiments will now be described in further detail with regard semiconductor integrated circuit devices comprising stacked CMOS device structures (alternatively, stacked complementary transistor structures) with reduced CMOS cell sizes, and methods for fabricating such semiconductor integrated circuit devices. As explained in further detail below, a reduction in the CMOS cell size of a stacked CMOS device structure is realized by forming backside source/drain contacts to a backside interconnect structure (e.g., backside power distribution network), thereby allowing (i) longitudinal (vertical) alignment of drain contacts to drain elements of the stacked complementary transistor structure, and (ii) longitudinal (vertical) alignment of source contacts to source elements of the stacked complementary transistor structure.

As further explained in further detail below, exemplary embodiments of the disclosure further comprise techniques to enable backside removal of a portion of a semiconductor substrate in contact with the stacked complementary transistor structure to provide isolation from the semiconductor substrate and thereby obviate the need to implement a dedicated process module to achieve such isolation. Moreover, as explained in further detail below, techniques are provided to enhance performance of a stacked complementary transistor structure by growing deep and high-quality epitaxial source/drain elements directly from a crystalline semiconductor substrate in conjunction with strain enhancement when backside removing the portion of the semiconductor substrates between the epitaxial source/drain elements.

For illustrative purposes, exemplary embodiments of the invention will be discussed in the context of stacked complementary transistor structures comprising nanosheet FET devices. It is to be understood, however, that the exemplary embodiments discussed herein are readily applicable to various types of gate-all-around (GAA) FET devices such nanowire FETs, and other types of GAA FET devices having gate structures that are formed around all sides of active channel layers. Moreover, the exemplary techniques disclosed herein can be implemented with stacked fin-type FET (FinFET) devices.

It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

It is to be understood that the same or similar reference numbers are used throughout the drawings to denote the same or similar features, elements, or structures, and thus, a detailed explanation of the same or similar features, elements, or structures will not be repeated for each of the drawings. Further, the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount. The word "over" as used herein to describe forming a feature (e.g., a layer) "over" a side or surface, means that the feature (e.g., the layer) may be formed "directly on" (i.e., in direct contact with) the implied side or surface, or that the feature (e.g., the layer) may be formed "indirectly on" the implied side or surface with one or more additional layers disposed between the feature (e.g., the layer) and the implied side or surface.

To provide spatial context to the different structural orientations of the semiconductor structures shown throughout the drawings, XYZ Cartesian coordinates are shown in each of the drawings. The terms "vertical" or "vertical direction" or "vertical height" as used herein denote a Z-direction of the Cartesian coordinates shown in the drawings, and the terms "horizontal," or "horizontal direction," or "lateral direction" as used herein denote an X-direction and/or a Y-direction of the Cartesian coordinates shown in the drawings.

FIG. 1 is schematic cross-sectional side view of a semiconductor integrated circuit device comprising a stacked complementary transistor structure, according to an exemplary embodiment of the disclosure. In particular, FIG. 1 is schematic cross-sectional side view (X-Z plane) of a semiconductor integrated circuit device 100 comprising a stacked complementary transistor structure (e.g., stacked complementary FET structure) comprising a first transistor 101 (e.g., a first FET device) and a second transistor 102 (e.g., a second FET device) disposed over the first transistor 101. In some embodiments, the first transistor 101 comprises a PFET device, and the second transistor 102 comprises an NFET device. In some embodiments, the first transistor 101 comprises an NFET device, and the second transistor 102 comprises a PFET device. In some embodiments, as shown in FIG. 1, the first and second transistors 101 and 102 comprise nanosheet FET devices.

In particular, in the exemplary embodiment of FIG. 1, the first transistor 101 comprises a nanosheet FET device comprising a plurality of active nanosheet channel layers 112 and 114, and a first source/drain element 160-1 and a second source/drain element 160-2. The second transistor 102 comprises a nanosheet FET device comprising a plurality of active nanosheet channel layers 122 and 124, and a first source/drain element 162-1 and a second source/drain element 162-2. It is to be understood that the term "source/drain element" as used herein means that a given source/drain element can be either a source element or a drain element of the given FET device, depending on the application or circuit configuration.

In addition, the first and second transistors 101 and 102 comprise a common gate structure which comprises gate sidewall spacers 134 and 136, and a metal gate 180. In some embodiments, the metal gate 180 comprises a high-k metal gate (HKMG) structure. The gate sidewall spacers 134 and 136 define a common gate region of first and second transistors 101 and 102, which surrounds/contains the metal gate 180. The gate sidewall spacer 134 serves to electrically insulate the metal gate 180 from surrounding elements, and the gate sidewall spacers 136 comprise embedded gate sidewall spacers (or internal spacers) which are formed between end portions of the active nanosheet channel layers 112, 114, 122, and 124, and serve to insulate the metal gate 180 from the source/drain elements 160-1, 160-2, 162-1, and 162-2. The metal gate 180 encapsulates the portions of the active nanosheet channel layers 112, 114, 122, and 124, which define a gate length (LG) of the first and second transistors 101 and 102, although the active nanosheet channel layers 112, 114, 122, and 124 are physically longer (length L) than the gate length LG. The first and second transistors 101 and 102 are isolated by a dielectric isolation layer 150.

The semiconductor integrated circuit device 100 further comprises a shallow trench isolation (STI) layer 140, a dielectric liner layer 170, a first insulating layer 175 (or first interlayer dielectric (ILD) layer), a second insulating layer 176 (or second ILD layer), a gate contact 190, source/drain contacts 191, 192, and 193, a first interconnect structure 200 (e.g., a BEOL interconnect structure), a backside insulating layer 205, and a second interconnect structure 210 (e.g., a backside power distribution network). The gate contact 190 provides a connection between the metal gate 180 and the first interconnect structure 200. The source/drain contact 191 is commonly connected to the first source/drain elements 160-1 and 162-1 of the first and second transistors 101 and 102, and provides a common connection between the first interconnect structure 200 and the source/drain elements 160-1 and 162-1 of the first and second transistors 101 and 102. The source/drain contact 192 provides a connection between the first interconnect structure 200 and the second source/drain element 162-2 of the second transistor 102. The source/drain contact 193 provides a connection between the second source/drain element 160-2 of the first transistor 101 and the second interconnect structure 210. In some embodiments, the first interconnect structure 200 comprises a BEOL interconnect structure which comprises a frontside I/O signal network and power distribution network. In some embodiments, the second interconnect structure 210 comprises a backside power distribution network. In some embodiments, the second interconnect structure 210 comprises both a backside I/O signal network and a power distribution network.

In an exemplary embodiment, FIG. 1 schematically illustrates a complementary inverter cell (alternatively, CMOS inverter cell). For example, assume that the first transistor 101 is a PFET, the second transistor 102 is an NFET, the first source/drain elements 160-1 and 162-1 are drain elements of the first and second transistors 101 and 102, and that the second source/drain elements 160-2 and 162-2 are source elements of the first and second transistors 101 and 102. In this instance, gate contact 190 provides an input terminal to the CMOS inverter, the source/drain contact 191 provides an output terminal of the CMOS inverter, which is commonly connected to the source/drain elements 160-1 and 162-1 (e.g., drain terminals) which form the output node of the CMOS inverter. Furthermore, the source/drain contact 192 connects the second source/drain element 162-2 (e.g., source terminal) of the second transistor 102 to a negative power supply voltage VSS (e.g., ground (GND) voltage) which is supplied by a power distribution network of the first interconnect structure 200, and the backside source/drain contact 193 connects the second source/drain element 160-2 (e.g., source terminal) of the first transistor 101 to a positive power supply voltage VDD which is supplied by a power distribution network of the second interconnect structure 210.

In another embodiment of the CMOS inverter cell, the first transistor 101 is an NFET, and the second transistor 102 is a PFET. In this instance, the source/drain contact 192 connects the second source/drain element 162-2 (e.g., source terminal) of the second transistor 102 to a positive power supply voltage VDD which is supplied by the power distribution network of the first interconnect structure 200, and the backside source/drain contact 193 connects the second source/drain element 160-2 (e.g., source terminal) of the first transistor 101 to a negative power supply voltage VSS (e.g., GND) which is supplied by a backside power distribution network of the second interconnect structure 210.

The exemplary stacked complementary transistor architecture of FIG. 1 provides various advantages over conventional structures. For example, the exemplary stacked complementary transistor structure shown in FIG. 1 provides a reduction in the CMOS cell size by virtue of forming backside source/drain contacts (e.g., source/drain contact 193) to the source/drain elements of the first transistor 101 for connecting to the second interconnect structure 210, and forming frontside source/drain contacts to the source/drain elements of the second transistor 102 for connecting to the first interconnection structure 200. This configuration allows longitudinal alignment of separate source/drain contacts to the respective first source/drain elements 160-1 and 162-1 of the stacked first and second transistors 101 and 102, and/or longitudinal alignment of separate source/drain contacts to the respective second source/drain elements 160-2 and 162-2 of the stacked first and second transistors 101 and 102. For example, in the exemplary embodiment of FIG. 1, the second source/drain element 160-2 of the first transistor 101 is connected to the second interconnect structure 210 by the source/drain contact 193, which allows the source/drain contact 193 to be longitudinal aligned (e.g., vertically aligned in the Z-direction) with the source/drain contact 192. For illustration, a dashed line is shown in FIG. 1 to represent an exemplary state of longitudinal alignment of the source/drain contacts 192 and 193.

In contrast, in a conventional stacked CMOS cell which does not implement the second (backside) interconnect structure 210, the lateral size of the second source/drain element 160-2 of the first transistor 101 would have to be increased (in the X-direction) to provide a landing area to enable connection of a source/drain contact which extends from the first interconnect structure 200 to the second source/drain element 160-2. This conventional configuration increases the CMOS cell size as a result of the increased lateral size of the second source/drain element 160-2 which would be needed to (i) provide sufficient contact area for the source/drain contact which extends from the first interconnect structure 200, and to (ii) ensure that there is sufficient lateral spacing between the adjacent source/drain contacts extending down from the first interconnect structure 200 and connected to the respective second source/drain elements 160-2 and 162-2 of the stacked first and second transistors 101 and 102.

Another advantage provided by exemplary stacked complementary transistor architecture of FIG. 1 is that formation of backside insulating layer 205 obviates the need to implement a dedicated process module to isolate the stacked complementary transistor structure from a semiconductor substrate. As explained in further detail below, a process module for forming the backside insulating layer 205 and the second interconnect structure 210 involves a backside removal of a portion of a semiconductor substrate in contact with the stacked complementary transistor structure, thereby naturally obtaining isolation between the semiconductor substrate and the stacked complementary transistor structure.

Moreover, the exemplary architecture of the stacked complementary transistor structure shown in FIG. 1 provides enhanced device performance by virtue of extended portions 160E of the first and second source/drain elements 160-1 and 160-2 of the first transistor 101, which extend below a bottom surface of the gate structure. As explained in further detail below, in some embodiments, the first and second source/drain elements 160-1 and 160-2 of the first transistor 101 comprises epitaxial source/drain elements which are epitaxially grown bottom-up starting at the bottom of trenches formed in a crystalline semiconductor substrate. When the crystalline semiconductor substrate is subsequently removed, the extended portions 160E are essentially released from the semiconductor substrate, thereby allowing the first and second source/drain elements 160-1 and 160-2 to apply strain to the active nanosheet channel layers 112 and 114 of the first transistor 101.

For example, for an NFET device, the first and second source/drain elements 160-1 and 160-2 will apply tensile strain to the active nanosheet channel layers 112 and 114 of the first transistor 101, which enhances the performance of the NFET device. Further, for a PFET device, the first and second source/drain elements 160-1 and 160-2 will apply compressive strain to the active nanosheet channel layers 112 and 114 of the first transistor 101, which enhances the performance of the PFET device. In this regard, extended portions 160E of the first and second source/drain elements 160-1 and 160-2 of the first transistor 101 allow for an increased size of the first and second source/drain elements 160-1 and 160-2 to enable strain enhancement, without increasing the CMOS cell size.

Figure 2:
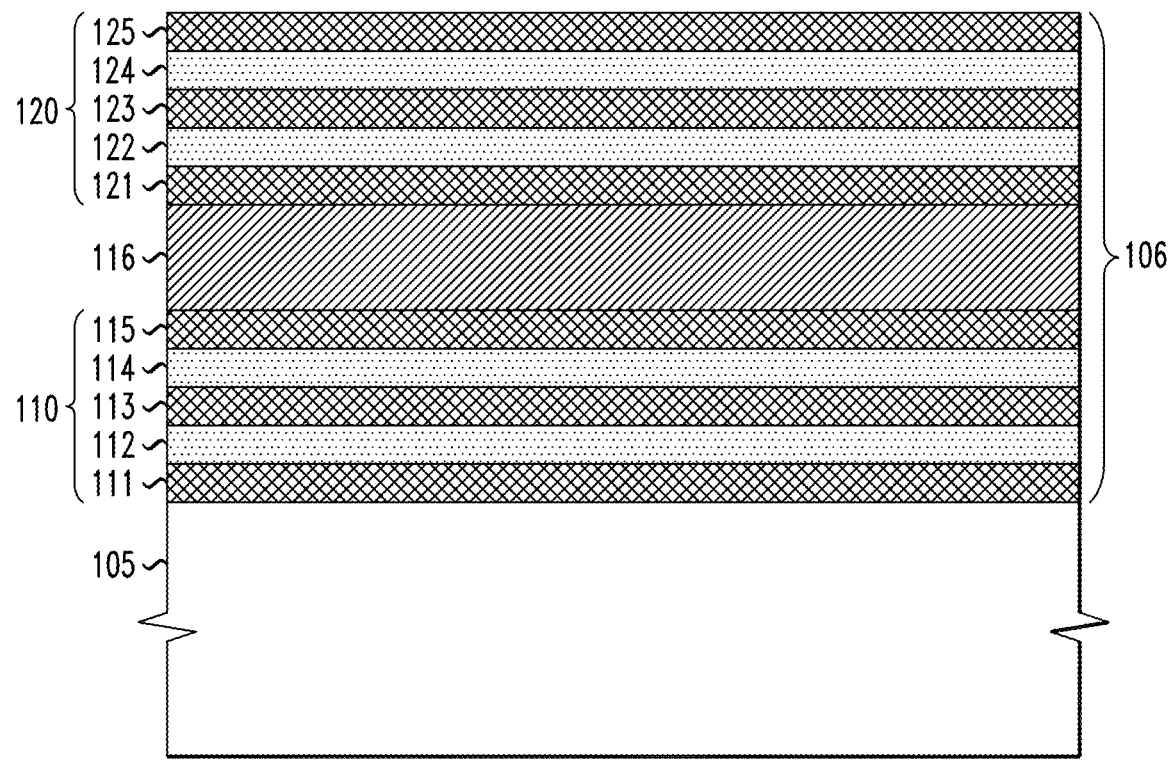

FIGS. 2-17 schematically illustrate a method for fabricating a semiconductor integrated circuit device comprising a stacked complementary transistor structure, according to an embodiment of the invention. In particular, for illustrative purposes, FIGS. 2-16 schematically illustrate a method for fabricating the semiconductor integrated circuit device 100 of FIG. 1. To begin, FIG. 2 is a schematic cross-sectional side view (X-Z plane) of an initial device structure of the semiconductor integrated circuit device at an initial stage of fabrication comprising a semiconductor substrate 105, and a nanosheet stack structure 106 formed on the semiconductor substrate 105. The nanosheet stack structure 106 comprises a stack of epitaxial semiconductor layers which comprise a first nanosheet stack 110, a sacrificial nanosheet layer 116, and a second nanosheet stack 120.

While the semiconductor substrate 105 is illustrated as a generic substrate layer, it is to be understood that the semiconductor substrate 105 may comprise one of different types of semiconductor substrate structures and materials. For example, in some embodiments, the semiconductor substrate 105 is a bulk semiconductor substrate (e.g., wafer) that is formed of crystalline semiconductor material including, but not limited to, silicon (Si), germanium (Ge), or other types of semiconductor substrate materials that are commonly used in bulk semiconductor fabrication processes such as a silicon-germanium alloy, compound semiconductor materials (e.g., III-V), etc. In other embodiments, the semiconductor substrate 105 may be an active semiconductor layer of an SOI (silicon-on-insulator) substrate, GeOI (germanium-on-insulator) substrate, or other type of semiconductor-on-insulator substrate, which comprises an insulating layer (e.g., oxide layer) disposed between a base substrate layer (e.g., silicon substrate) and the active semiconductor layer (e.g., Si, Ge, etc.) in which active circuit components are formed as part of a front-end-of-line (FEOL) structure. It is to be noted that in each drawing, the X-Y plane represents a plane that is parallel to the plane of the semiconductor substrate 105 (e.g., wafer) being processed.

In the exemplary embodiment of FIG. 2, the first nanosheet stack 110 comprises a stack of alternating epitaxial semiconductor layers 111, 112, 113, 114, and 115 which are utilized to form the first transistor 101 of FIG. 1. The second nanosheet stack 120 comprises a stack of alternating epitaxial semiconductor layers 121, 122, 123, 124, and 125 which are utilized to form the second transistor 102 of FIG. 1. The sacrificial nanosheet layer 116 comprises a sacrificial layer which serves as a placeholder to enable epitaxy growth of the second nanosheet stack 120 over the first nanosheet stack 110, but where the sacrificial nanosheet layer 116 is subsequently replaced with a dielectric material to form the dielectric isolation layer 150 between the first and second transistors 101 and 102.

The stack of alternating epitaxial semiconductor layers 111-115 of the first nanosheet stack 110 comprises sacrificial nanosheet layers 111, 113, and 115, and active nanosheet channel layers 112 and 114, wherein each active nanosheet channel layer 112 and 114 is disposed between the sacrificial nanosheet layers in the first nanosheet stack 110. The stack of alternating epitaxial semiconductor layers 121-125 of the second nanosheet stack 120 comprises sacrificial nanosheet layers 121, 123, and 125, and active nanosheet channel layers 122 and 124, wherein each active nanosheet channel layer 122 and 124 is disposed between the sacrificial nanosheet layers in the second nanosheet stack 120. The epitaxial semiconductor layers of the nanosheet stack structure 106 are sequentially grown.

For example, the first nanosheet stack 110 is formed by a process flow in which the sacrificial nanosheet layer 111 is epitaxially grown on a surface of the semiconductor substrate 105, the active nanosheet channel layer 112 is epitaxially grown on the sacrificial nanosheet layer 111, the sacrificial nanosheet layer 113 is epitaxially grown on the active nanosheet channel layer 112, the active nanosheet channel layer 114 is epitaxially grown on the sacrificial nanosheet layer 113, and the sacrificial nanosheet layer 115 is epitaxially grown on the active nanosheet channel layer 114. Next, the sacrificial nanosheet layer 116 is epitaxially grown on the sacrificial nanosheet layer 115. The second nanosheet stack 120 is formed by a process flow in which the sacrificial nanosheet layer 121 is epitaxially grown on the sacrificial nanosheet layer 116, the active nanosheet channel layer 122 is epitaxially grown on the sacrificial nanosheet layer 121, the sacrificial nanosheet layer 123 is epitaxially grown on the active nanosheet channel layer 122, the active nanosheet channel layer 124 is epitaxially grown on the sacrificial nanosheet layer 123, and the sacrificial nanosheet layer 125 is epitaxially grown on the active nanosheet channel layer 124.

In some embodiments, the epitaxial semiconductor layers of the nanosheet stack structure 106 comprise single crystal (monocrystalline) semiconductor materials, which are epitaxially grown using known methods such as chemical vapor deposition (CVD), metal-organic chemical vapor deposition (MOCVD), low pressure chemical vapor deposition (LPCVD), molecular beam epitaxy (MBE), vapor-phase epitaxy (VPE), liquid-phase epitaxy (LPE), metal organic molecular beam epitaxy (MOMBE), rapid thermal chemical vapor deposition (RTCVD), low-energy plasma deposition (LEPD), ultra-high vacuum chemical vapor deposition (UHVCVD), atmospheric pressure chemical vapor deposition (APCVD), or other known epitaxial growth techniques which are suitable for the given process flow.

The types of materials that are utilized to form the epitaxial semiconductor layers 111-115 of the first nanosheet stack 110, and the epitaxial semiconductor layers 121-125 of second nanosheet stack 120 will depend on various factors such as the type of nanosheet FET device (p-type, or n-type), and the desired level of etch selectivity between the semiconductor layers, as well as provide sufficient lattice matching between the materials of the semiconductor layers to ensure proper (e.g., defect-free) epitaxial growth of the crystalline semiconductor layers.

For example, in some embodiments, the active nanosheet channel layers 112 and 114 of the first nanosheet stack 110, and the active nanosheet channel layers 122 and 124 of the second nanosheet stack 120 are formed of epitaxial silicon (or crystalline Si). In some embodiments, the active nanosheet channel layers 112 and 114 of the first nanosheet stack 110 can be doped to tune a desired threshold voltage of the first transistor 101, and the active nanosheet channel layers 122 and 124 of the second nanosheet stack 120 can be doped to tune a desired threshold voltage of the second transistor 102.

When the active nanosheet channel layers 112, 114, 122, and 124 are formed of crystalline Si, the sacrificial nanosheet layers 111, 113, 115, 121, 123, and 125 (which serve as sacrificial layers that are subsequently etched away to release the active nanosheet channel layers 112, 114, 122, and 124), can be formed of an epitaxial silicon-germanium (SiGe) alloy. This allows the epitaxial SiGe material of the sacrificial nanosheet layers 111, 113, 115, 121, 123, and 125 to be etched selective to the epitaxial Si material of the active nanosheet channel layers 112, 114, 122, and 124 in a subsequent process step to "release" the active nanosheet channel layers 112, 114, 122, and 124. In other embodiments, the active nanosheet channel layers 112, 114, 122, and 124 can be formed of an epitaxial SiGe material with a desired Ge concentration (optimized for device performance), and sacrificial nanosheet layers 111, 113, 115, 121, 123, and 125 can be formed of a sacrificial semiconductor material (e.g., Si) that can be etched selective to the active nanosheet channel layers 112, 114, 122, and 124. While the first and second nanosheet stacks 110 and 120 are shown to include two active nanosheet channel layers 112 and 114, and 122 and 124, in other embodiments of the invention, the first and second nanosheet stacks 110 and 120 can be fabricated with more than two active nanosheet channel layers.

The sacrificial nanosheet layer 116 is formed of an epitaxial semiconductor material that can be etched selective to the epitaxial semiconductor materials of the active nanosheet channel layers 112, 114, 122, and 124, and the sacrificial nanosheet layers 111, 113, 115, 121, 123, and 125. For example, in embodiments where the active nanosheet channel layers 112, 114, 122, and 124 are formed of epitaxial silicon material, and the sacrificial nanosheet layers 111, 113, 115, 121, 123, and 125 are formed of an epitaxial SiGe alloy, the sacrificial nanosheet layer 116 can be formed of an epitaxial SiGe alloy material, which has a different Ge concentration than the Ge concentration the epitaxial SiGe alloy material of the sacrificial nanosheet layers 111, 113, 115, 121, 123, and 125. For example, the epitaxial SiGe alloy material of the sacrificial nanosheet layers 111, 113, 115, 121, 123, and 125 can have a Ge concentration of 25%, while the epitaxial SiGe alloy material of the sacrificial nanosheet layer 116 can have a Ge concentration of 50%, which provides etch selectivity of the sacrificial nanosheet layer 116 with respect to the sacrificial nanosheet layers 111, 113, 115, 121, 123, and 125.

The thickness of the sacrificial nanosheet layer 116 is selected based on a target thickness which is desired for the dielectric isolation layer 150 between the first and second transistors 101 and 102, which is subsequently formed to replace the sacrificial nanosheet layer 116. Further, the thickness of the sacrificial nanosheet layers 111, 113, and 115 of the first nanosheet stack 110 defines a spacing size (or channel spacing) above and below the active nanosheet channel layers 112 and 114, in which high-k dielectric material and work function metal is subsequently formed. Similarly, the thickness of the sacrificial nanosheet layers 121, 123, and 125 of the second nanosheet stack 120 defines a spacing size (or channel spacing) above and below the active nanosheet channel layers 122 and 124, in which high-k dielectric material and work function metal is subsequently formed. The spacing size and the type of work function material(s) disposed in the spaces above and below the active nanosheet channel layers 112 and 114, and 122 and 124 defines, in part, the threshold voltage (Vt) of the first and second (nanosheet FET) transistors 101 and 102. In some embodiments, the thickness of the sacrificial nanosheet layers 111, 113, 115, 121, 123, and 125 is in a range of about 6 nm to about 10 nm.

Figure 3A:
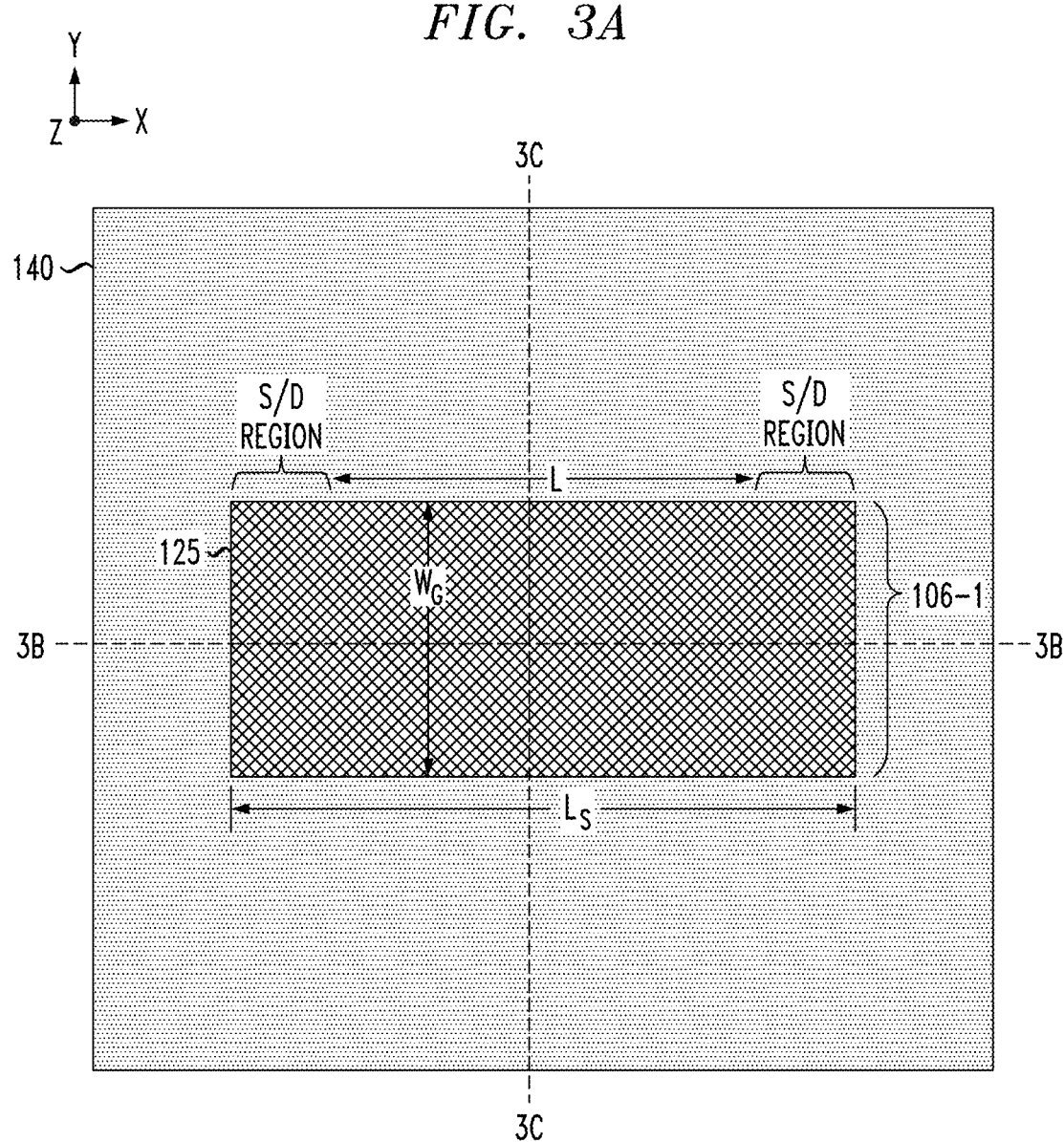
FIGS. 3A, 3B, and 3C are schematic views of a next intermediate structure of the semiconductor integrated circuit device, which is constructed by patterning the nanosheet stack structure of FIG. 2 to form a patterned nanosheet stack structure, and forming a shallow trench isolation layer in the semiconductor substrate, according to an exemplary embodiment of the disclosure.
Figure 3B:
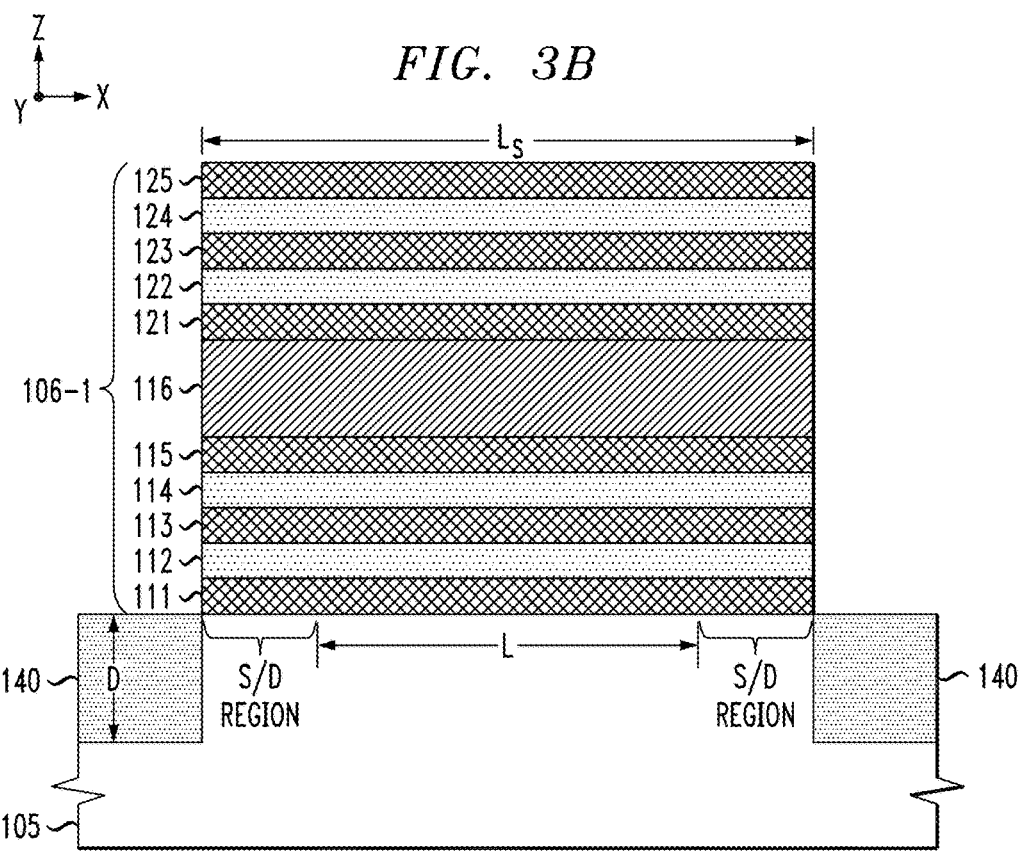
Figure 3C:
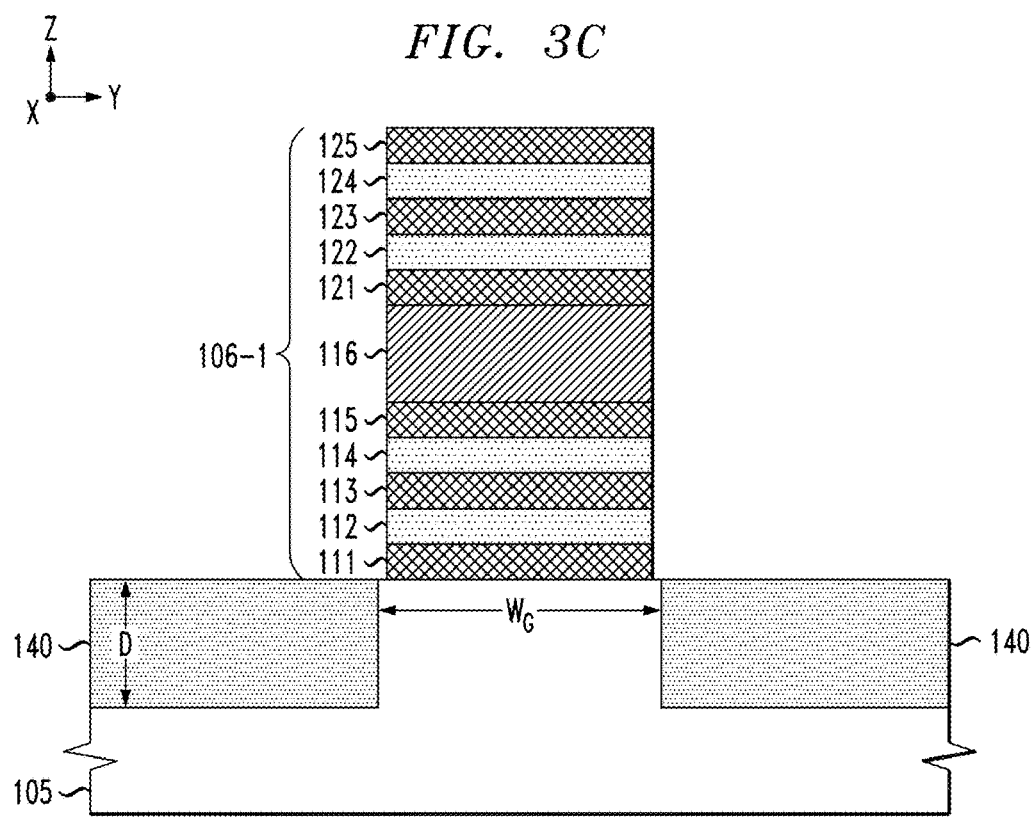

Next, FIGS. 3A, 3B, and 3C are schematic views of a next intermediate structure of the semiconductor integrated circuit device, which is constructed by patterning the nanosheet stack structure 106 of FIG. 2 to form a patterned nanosheet stack structure, and forming a shallow trench isolation (STI) layer in the semiconductor substrate 105, according to an exemplary embodiment of the disclosure. More specifically, FIGS. 3A, 3B, and 3C schematically illustrates a next stage of the fabrication process in which the nanosheet stack structure 106 of FIG. 2 is patterned to form a patterned nanosheet stack structure 106-1 which defines a gate width $W_G$ of the first and second transistors 101 and 102, and the STI layer 140 is formed in the semiconductor substrate 105. FIG. 3A is a schematic top plan view (X-Y plane) of the intermediate semiconductor structure, FIG. 3B is a schematic cross-sectional side view (X-Z plane) of the intermediate semiconductor structure along line 3B-3B shown in FIG. 3A, and FIG. 3C is a schematic cross-sectional side view (Y-Z plane) of the intermediate semiconductor structure along line 3C-3C shown in FIG. 3A.

As shown in FIGS. 3A, 3B, and 3C the patterning of the nanosheet stack structure 106 (FIG. 2) results in forming the patterned nanosheet stack structure 106-1 having a width which defines a gate width $W_G$ of the active nanosheet channel layers 112, 114, 122, and 124 first and second transistors 101 and 102, and a stack length $L_S$ which defines an overall target length in a gate structure and source/drain (S/D) regions formed on opposing sides of the gate structure. In some embodiments, the gate width $W_G$ is larger (e.g., 2× or more) than the thickness of the active nanosheet channel layers 112, 114, 122, and 124 of the first and second transistors 101 and 102.

In some embodiments, a patterning process is performed by forming an etch mask (e.g., a lithographic mask or hard mask) on the nanosheet stack structure 106 (FIG. 2), wherein the etch mask comprises an image of the patterned nanosheet stack structure 106-1 and STI trenches to be formed in an upper surface of the semiconductor substrate 105. The nanosheet stack structure 106 and semiconductor substrate 105 are then etched using sequence of one or more dry etch processes (e.g., reactive ion etching (ME)) to etch down through the layers of the nanosheet stack structure 106 (to form the patterned nanosheet stack structure 106-1), and then into the semiconductor substrate 105 to form STI trenches around the patterned nanosheet stack structure 106-1. The etch mask can be formed using any suitable patterning process including, but not limited to, a photolithography process, or a multi-patterning process such as a sidewall image transfer (SIT) process, a self-aligned double patterning (SADP) process, a self-aligned quadruple patterning (SAQP), etc. The etching can be performed using one or more sequential dry etch processes with etch chemistries that are suitable to etch the materials of epitaxial semiconductor layers of the nanosheet stack structure 106 and the semiconductor substrate 105.

As shown in FIGS. 3B and 3C, the etch process results in the formation of the patterned nanosheet stack structure 106-1, as well as STI trenches formed to a depth D in an upper surface of the semiconductor substrate 105. The STI trenches are filled with an insulating material to form the STI layer 140. For example, in some embodiments, the STI layer 140 is formed by a process which comprises depositing a layer of insulating material over the surface of the semiconductor structure to cover the patterned nanosheet stack structure 106-1, planarizing the surface of the semiconductor structure (via chemical mechanical polishing (CMP)) down to an upper surface of patterned nanosheet stack structure 106-1 to remove the overburden insulating material, and then performing an etch-back (or recess) process to recess the remaining layer of insulating material down to an upper surface of the semiconductor substrate 105 to thereby form the STI layer 140. The STI layer 140 can be formed of any type of insulating material, such as a silicon oxide material, or a combination of multiple insulating materials such as forming a silicon nitride liner followed by a silicon oxide fill, etc. The insulating material(s) are deposited and patterned using known techniques.

Figure 4A:
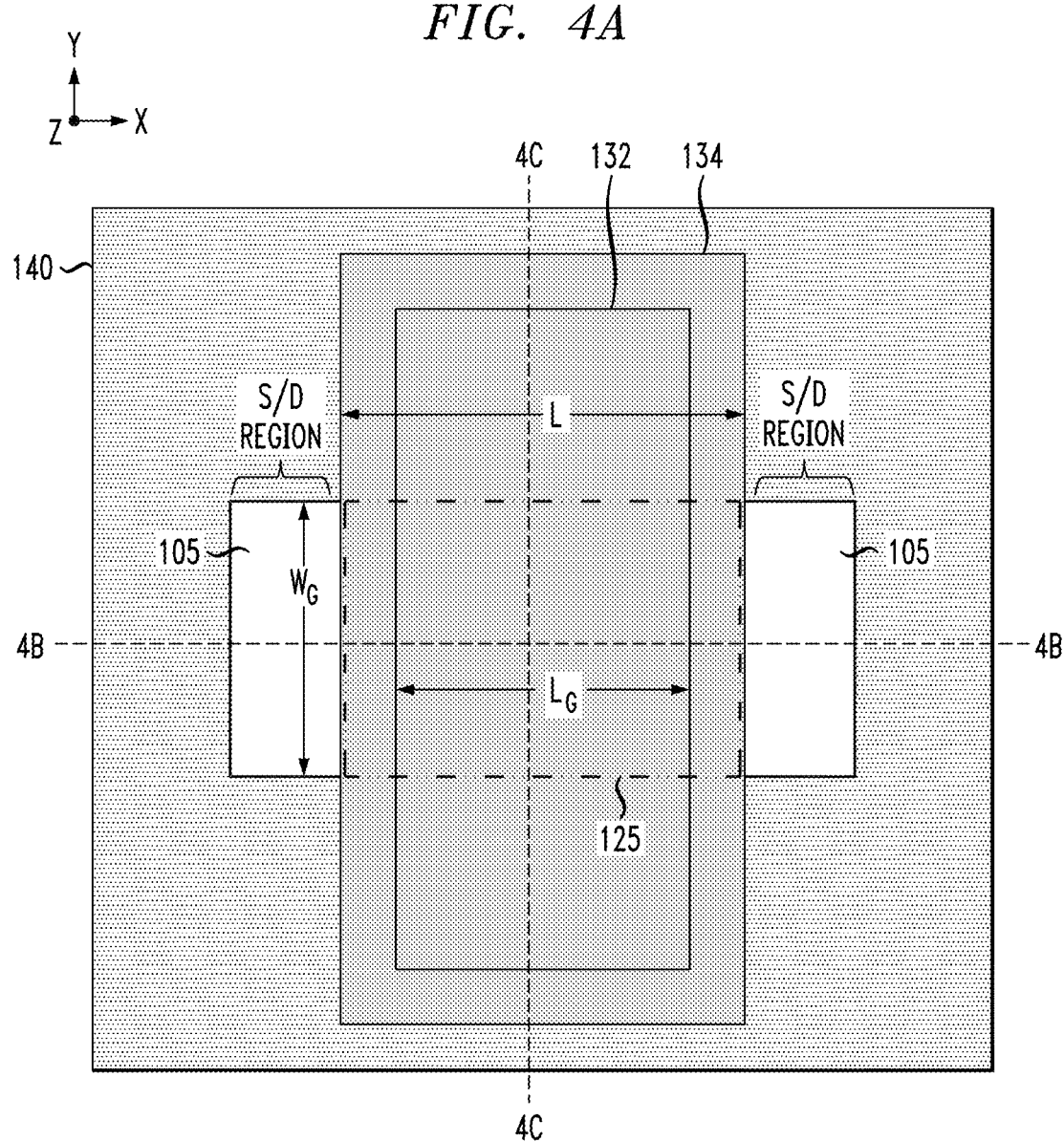
Figure 4C:
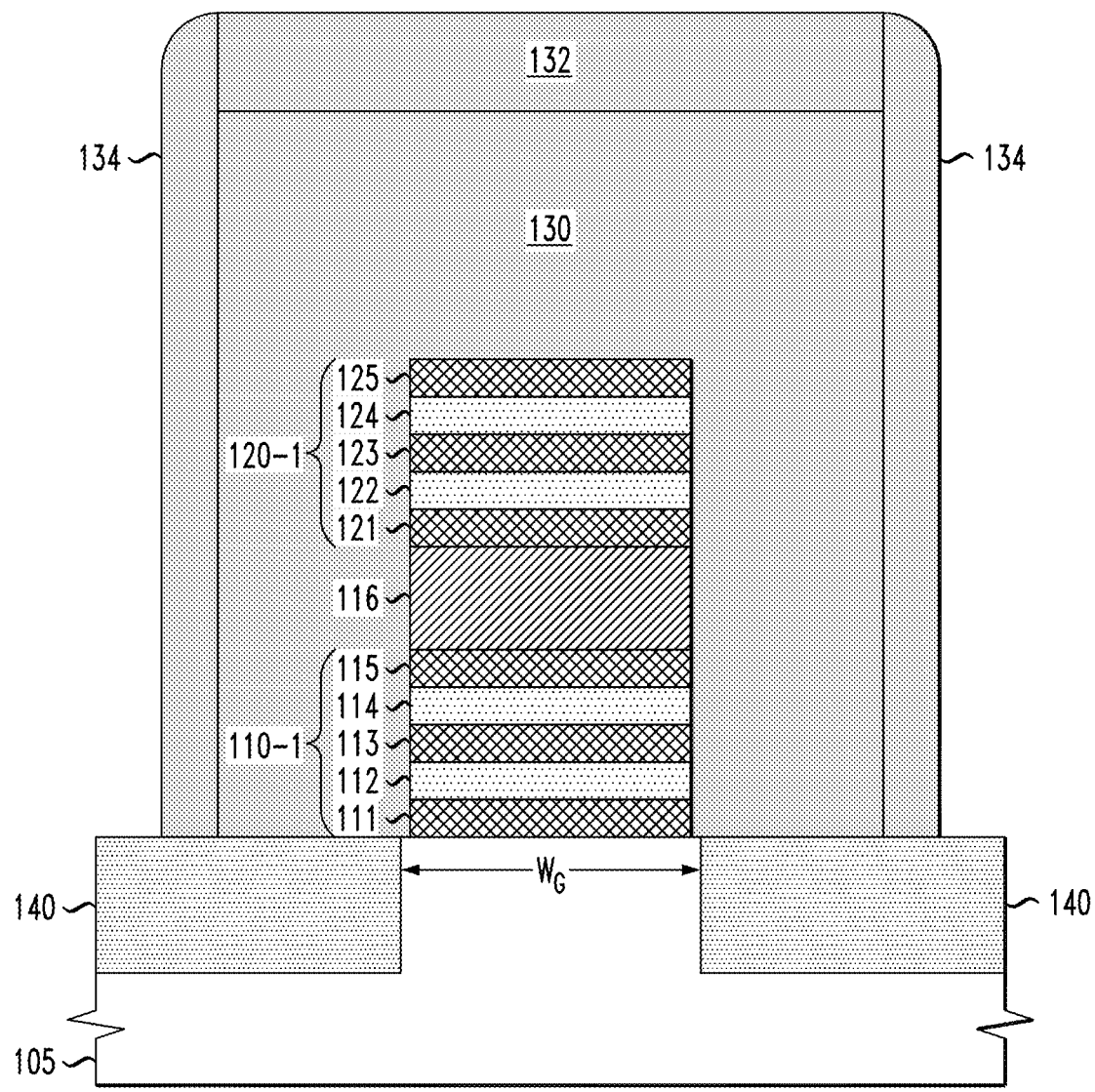

Next, FIGS. 4A, 4B, and 4C are schematic views of a next intermediate structure of the semiconductor integrated circuit device, which is constructed by forming a dummy gate structure which overlaps a portion of the patterned nanosheet stack structure 106-1, and patterning exposed portions of the patterned nanosheet stack structure 106-1 in the source/drain regions adjacent to the dummy gate structure to form respective first and second nanosheet channel structures 110-1 and 120-1 for the first and second transistors 101 and 102, according to an exemplary embodiment of the disclosure. In particular, FIG. 4A is a schematic top plan view (X-Y plane) of the intermediate device structure, FIG. 4B is a schematic cross-sectional side view (X-Z plane) of the intermediate device structure along line 4B-4B shown in FIG. 4A, and FIG. 4C is a schematic cross-sectional side view (Y-Z plane) of the resulting semiconductor structure along line 4C-4C shown in FIG. 4A.

As shown in FIGS. 4A, 4B, and 4C, the gate structure includes a dummy gate 130 (e.g., conformal oxide layer and a dummy gate electrode layer (e.g., sacrificial polysilicon or amorphous silicon material). In addition, the gate structure includes a gate capping layer 132, and a gate sidewall spacer 134. In some embodiments, the dummy gate 130 comprises a conformal dummy gate oxide layer and a dummy gate electrode layer (e.g., a sacrificial polysilicon material or amorphous silicon material). As explained in further detail below, the dummy gate 130 is subsequently removed as part of a replacement metal gate (RMG) process and replaced with a high-k gate dielectric material and metallic material to form a common HKMG gate structure for the first and second transistors 101 and 102.

The semiconductor device structure shown in FIGS. 4A, 4B, and 4C is fabricated using known methods. For example, a thin conformal layer of silicon oxide is deposited over the entire surface of the semiconductor structure shown in FIGS. 3A, 3B, and 3C, and a layer of polysilicon (or alternatively, amorphous silicon) is blanket deposited over the conformal layer of silicon oxide, and then planarized using known techniques. A hard mask layer is formed on the planarized surface of the polysilicon layer by depositing a layer of dielectric material or multiple layers of dielectric materials (e.g., SiN, SiOCN, SiBCN). The hard mask layer is then patterned to form the gate capping layer 132, which defines an image of the gate structure. The gate capping layer 132 is then utilized as an etch hard mask to anisotropically etch (e.g., RIE) the sacrificial polysilicon and oxide layers to thereby form the dummy gate 130.

The gate sidewall spacer 134 is then formed by depositing a conformal layer of dielectric material over the entire surface of the semiconductor structure. The conformal layer of dielectric material can be formed of SiN, SiBCN, SiCON, or any other type of low-k dielectric material that is commonly used to form insulating gate sidewall spacers of FET devices, and deposited using known techniques such as atomic layer deposition (ALD), CVD and PVD. The conformal layer of dielectric material is then patterned by performing an anisotropic dry etch process, such as RIE, to etch down the conformal layer of dielectric material in a vertical direction (Z-direction). This etch process is performed selective to the semiconductor materials of the patterned nanosheet stack structure 106-1 and the STI layer 140. The etch process results in the formation of the gate sidewall spacer 134, which surrounds the dummy gate 130 and the gate capping layer 132, as shown in FIGS. 4A-4C. The gate sidewall spacer 134 defines a gate region of the nanosheet FET device.

After forming the gate sidewall spacer 134, an anisotropic dry etch process (e.g., RIE) is performed to etch down the exposed portions of the patterned nanosheet stack structure 106-1 in the source/drain regions adjacent to the gate structure down to the upper surface of the semiconductor substrate 105 and the STI layer 140. As shown FIGS. 4A and 4B, the etch process results in (i) the formation of the respective first and second nanosheet channel structures 110-1 and 120-1 of the first and second transistors 101 and 102, and (ii) exposing portions of the semiconductor substrate 105 in the S/D regions. The first and second nanosheet channel structures 110-1 and 120-1 are formed with a defined length L in the X-direction (see FIGS. 4A and 4B). The gate width $W_G$ in the Y-direction (see FIGS. 4A and 4C) of the resulting first and second nanosheet channel structures 110-1 and 120-1 is maintained since the sidewall surfaces of the patterned nanosheet stack structure 106-1 which define the gate width $W_G$ are covered by the dummy gate 130 and the gate sidewall spacers 134 (see, e.g., FIG. 4C) during the etch process.

Figure 5:
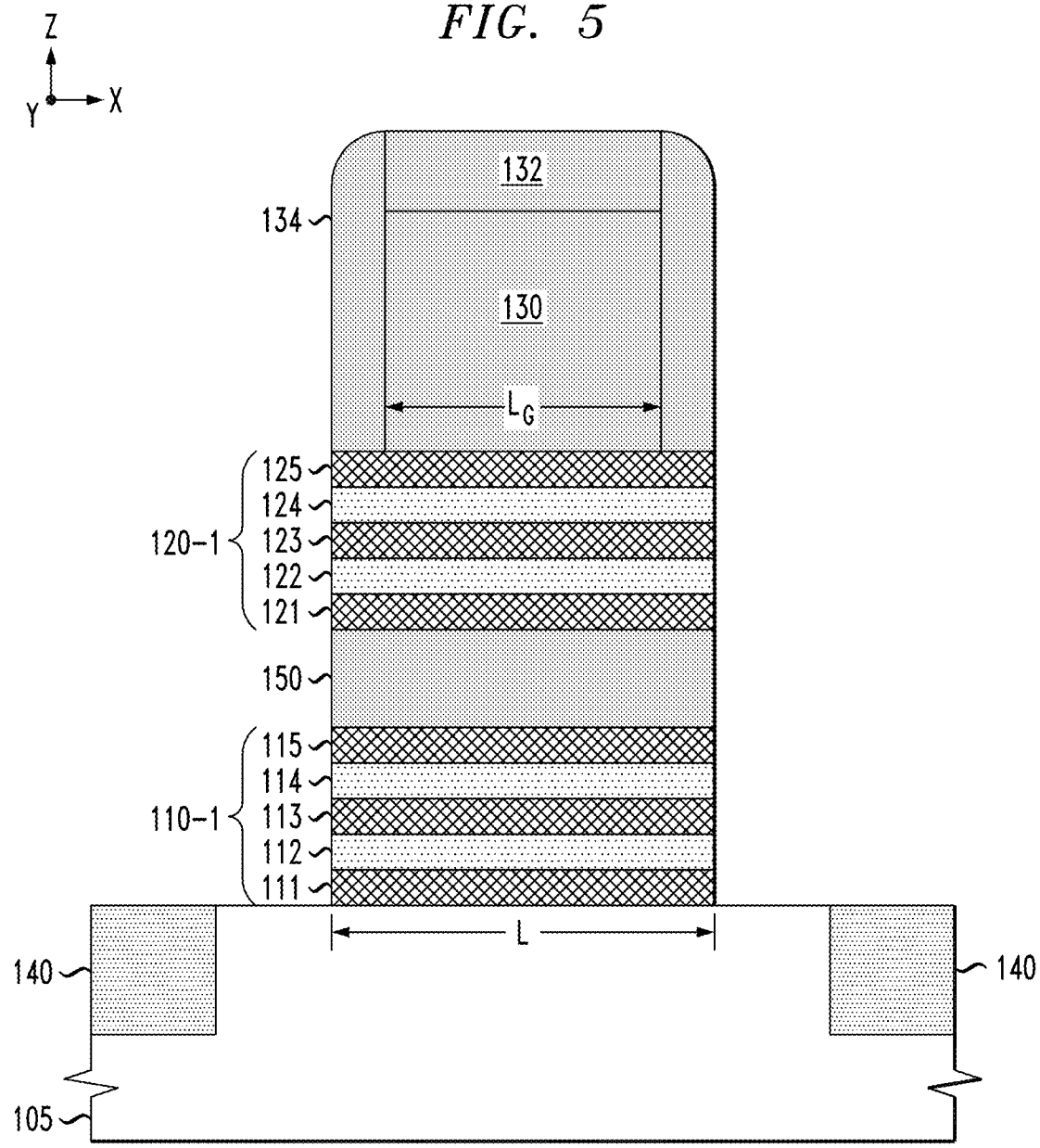

A next phase of the fabrication process comprises replacing the remaining portion of the sacrificial nanosheet layer 116, which is disposed between the first and second nanosheet channel structures 110-1 and 120-1 (as shown in FIGS. 4B and 4C), with the dielectric isolation layer 150 that isolates the first and second transistors 101 and 102. In particular, FIG. 5 is a schematic cross-sectional side view of a next intermediate structure of the semiconductor integrated circuit device structure, which is constructed by replacing a remaining portion of the sacrificial nanosheet layer 116 with the dielectric isolation layer 150 which isolates the stacked first and second transistors 101 and 102, according to an exemplary embodiment of the disclosure.

In some embodiments, the remaining portion of the sacrificial nanosheet layer 116 is removed by performing an etch process which is configured to each the material of the sacrificial nanosheet layer 116 selective to the materials of the surrounding structures/elements including the semiconductor substrate 105, the STI layer 140, the gate capping layer 132, the gate sidewall spacers 134, and the epitaxial semiconductor layers of the first and second nanosheet channel structures 110-1 and 120-1. As noted above, in some embodiments, the sacrificial nanosheet layer 116 is formed of SiGe alloy with a Ge concentration of 50% Ge, which can be etched highly selective to, e.g., the epitaxial semiconductor materials of the first and second nanosheet channel structures 110-1 and 120-1. In some embodiments, the sacrificial nanosheet layer 116 is removed using a dry-etch process using a suitable etching gas to selectivity etch the material of sacrificial nanosheet layer 116. The dielectric isolation layer 150 is then formed by depositing a conformal layer of dielectric material, such as silicon nitride, to fill the space between the first and second nanosheet channel structures 110-1 and 120-1, followed by a etch-back process to remove the overburden dielectric material.

Figure 6:
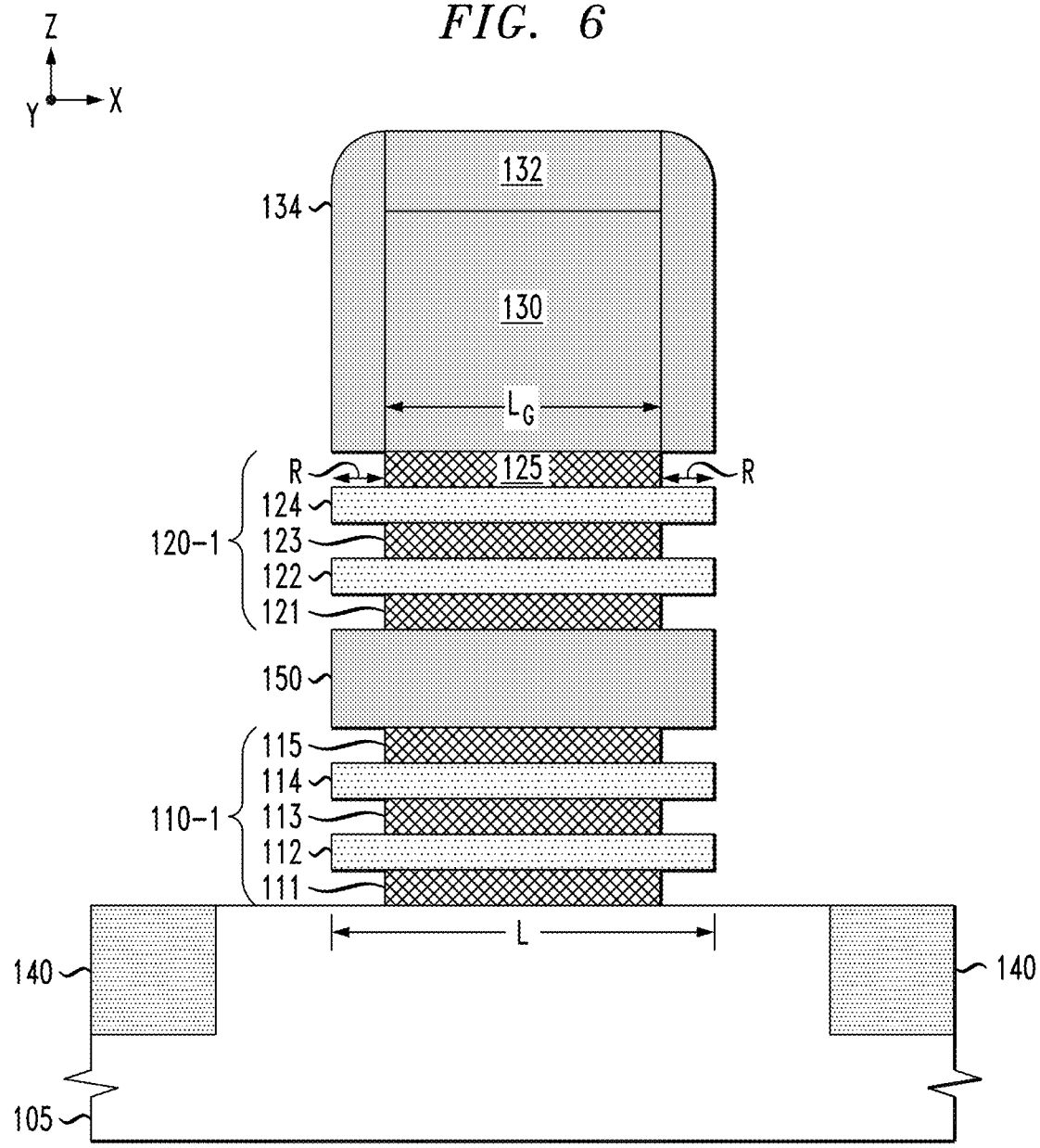

Next, FIG. 6 is a schematic cross-sectional side view of a next intermediate structure of the semiconductor integrated circuit device, which is constructed by laterally recessing exposed sidewall surfaces of the sacrificial nanosheet layers 111, 113, 115, 121, 123, and 125 of the first and second nanosheet channel structures 110-1 and 120-1 to form recesses R in the sidewalls of the first and second nanosheet channel structures 110-1 and 120-1. As shown in FIG. 6, the exposed sidewall surfaces of the sacrificial nanosheet layers 111, 113, 115, 121, 123, and 125 are recessed to a recess depth R (in the X-direction). In some embodiments, the depth of the lateral recess R is controlled through a timed etch. For example, in some embodiments, the sacrificial nanosheet layers 111, 113, 115, 121, 123, and 125 are recessed to a depth which is defined by the thickness of the gate sidewall spacer 134.

In some embodiments, the lateral etch process can be performed using an isotropic wet etch process with an etch solution that is suitable to etch the semiconductor material (e.g., SiGe) of the sacrificial nanosheet layers 111, 113, 115, 121, 123, and 125 selective to the semiconductor material (e.g., Si) of the active nanosheet channel layers 112, 114, 122, and 124, and other exposed elements. In some embodiments, an isotropic dry plasma etch process can be performed to laterally etch the exposed sidewall surfaces of the sacrificial nanosheet layers 111, 113, 115, 121, 123, and 125 selective to the active nanosheet channel layers 112, 114, 122, and 124, and other exposed elements.

Figure 7:
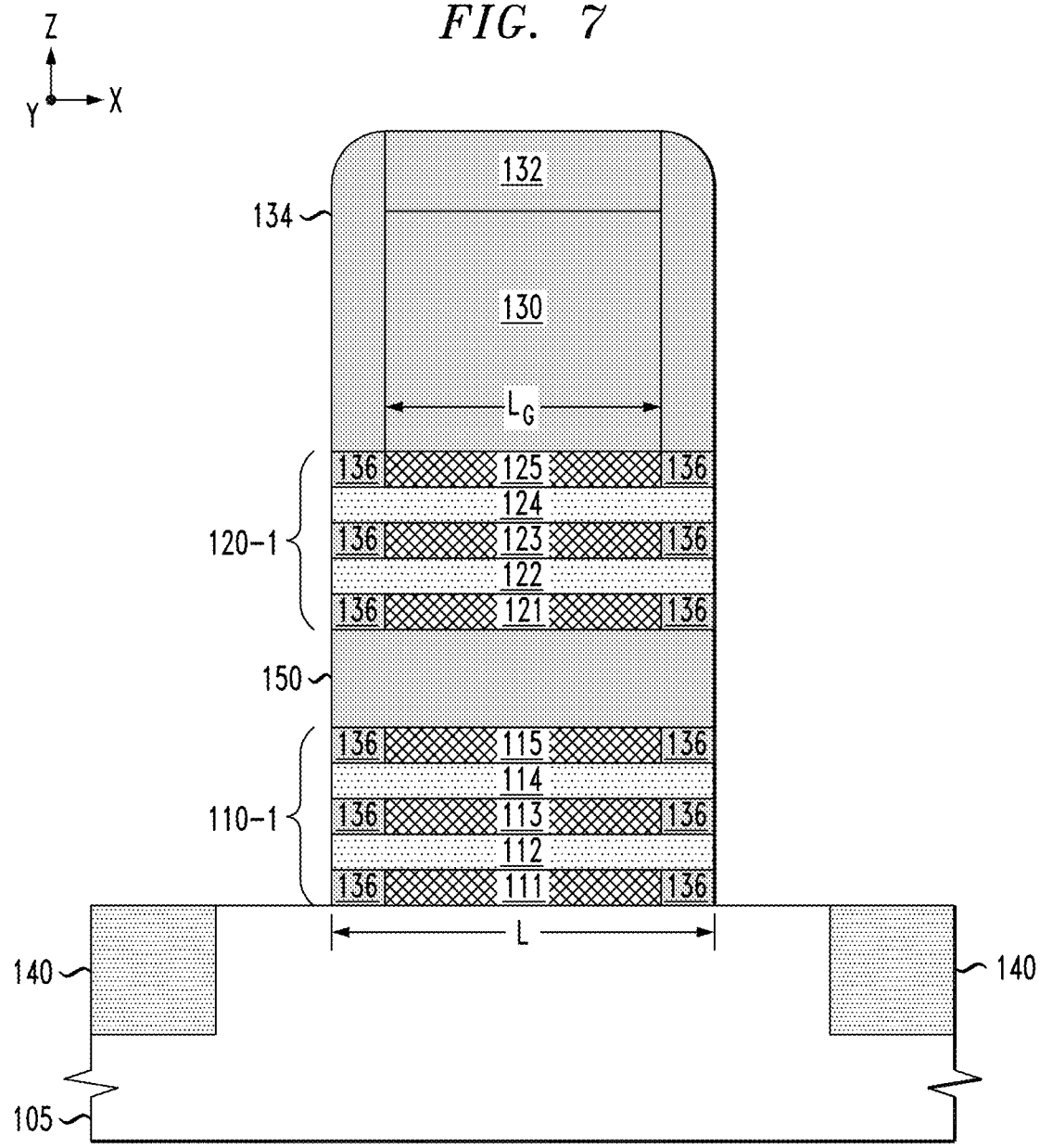

A next phase of the fabrication process comprises forming the embedded gate sidewall spacers 136 within the recesses R in the sidewalls of the of the first and second nanosheet channel structures 110-1 and 120-1. For example, FIG. 7 is a schematic cross-sectional side view of a next intermediate structure of the semiconductor integrated circuit device, which is constructed by forming the embedded gate sidewall spacers 136 within the recesses R in the sidewalls of the of the first and second nanosheet channel structures 110-1 and 120-1, according to an exemplary embodiment of the disclosure. In some embodiments, the embedded gate sidewall spacers 136 are formed of the same dielectric material used to form the gate sidewall spacer 134. For example, the embedded gate sidewall spacers 136 can be formed of SiN, SiBCN, SiCO, SiBCN, SiCON, or any other type of dielectric material (e.g., a low-k dielectric material having a k of less than 5, wherein k is the relative dielectric constant) which is used to form the gate sidewall spacer 134 of the gate structure.

In some embodiments, the embedded gate sidewall spacers 136 are formed by depositing a conformal layer of dielectric material over the intermediate device structure of FIG. FIG. 6 until the recesses R are filled with dielectric material, followed by an etch back to remove the excess dielectric material from the gate structure and the substrate.

Figure 8:
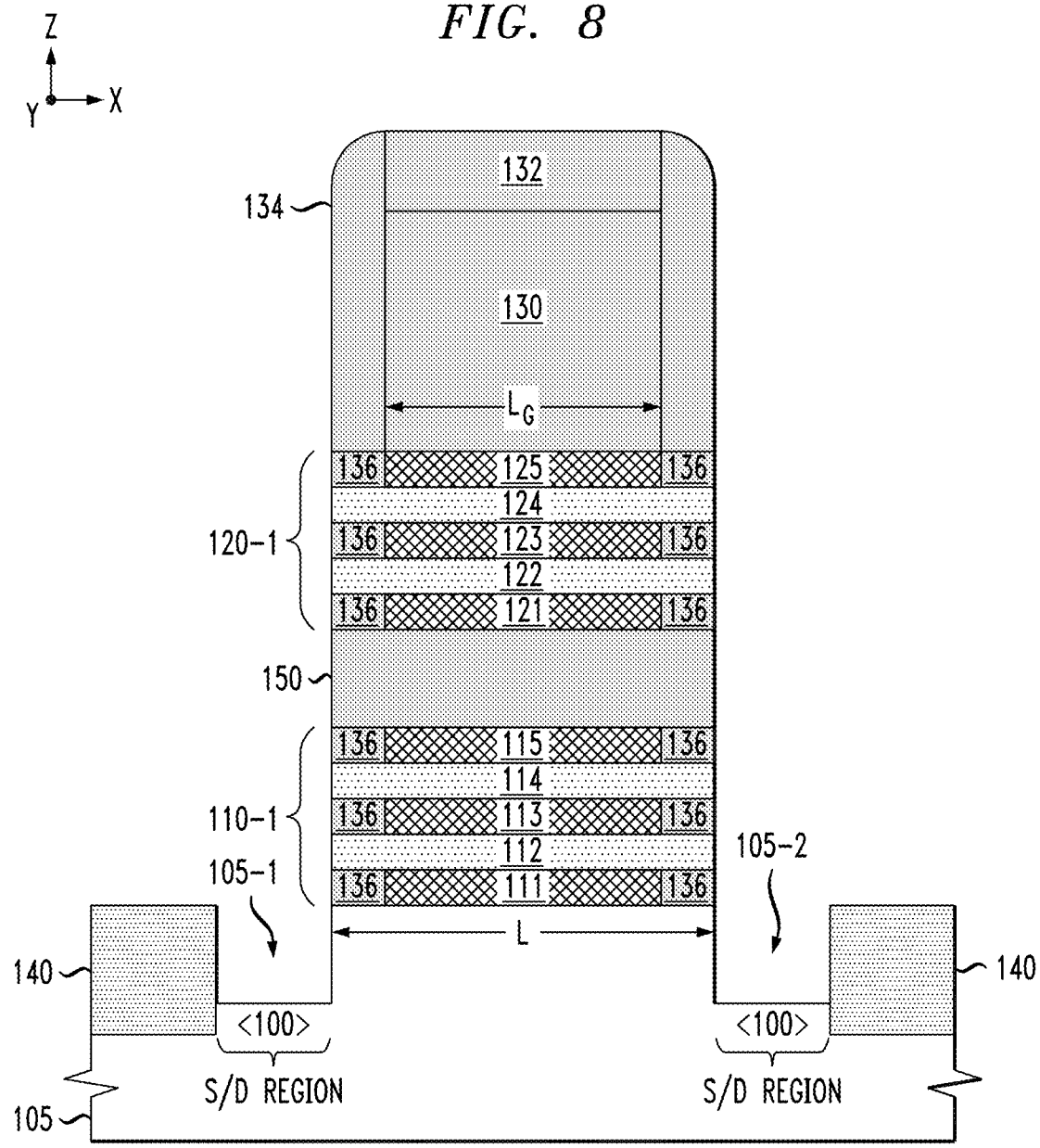

The dielectric material is deposited using a highly conformal deposition process, such as ALD, to ensure that the recesses R are sufficiently filled with dielectric material. The conformal layer of dielectric material can be etched back using an isotropic (wet or dry) etch process to remove the excess dielectric material, while leaving the dielectric material in the recesses R to form the embedded gate sidewall spacers 136. The wet etch process may include, but is not limited to, buffered hydrofluoric acid (BHF), diluted hydrofluoric acid (DHF), hydrofluoric nitric acid (HNA), phosphoric acid, HF diluted by ethylene glycol (HFEG), hydrochloric acid (HCl), or any combination thereof Next, FIG. 8 is a schematic cross-sectional side view of a next intermediate structure of the semiconductor integrated circuit device, which is constructed by recessing the exposed portions of the semiconductor substrate 105 in the S/D regions to form a first trench 105-1 and a second trench 105-2 in the semiconductor substrate 105, according to an exemplary embodiment of the disclosure. The first and second trenches 105-1 and 105-2 are formed to enable formation of the extended portions 160E of the first and second source/drain elements 160-1 and 160-2 of the first transistor 101 (FIG. 1), which extend below a bottom surface of the gate structure. As shown in FIG. 8, a bottom surface of the first and second trenches 105-1 and 105-2 provides, e.g., a <100> crystalline silicon surface for epitaxially growing the first and second source/drain elements 160-1 and 160-2 of the first transistor 101, as schematically shown in FIG. 9.

Figure 9:
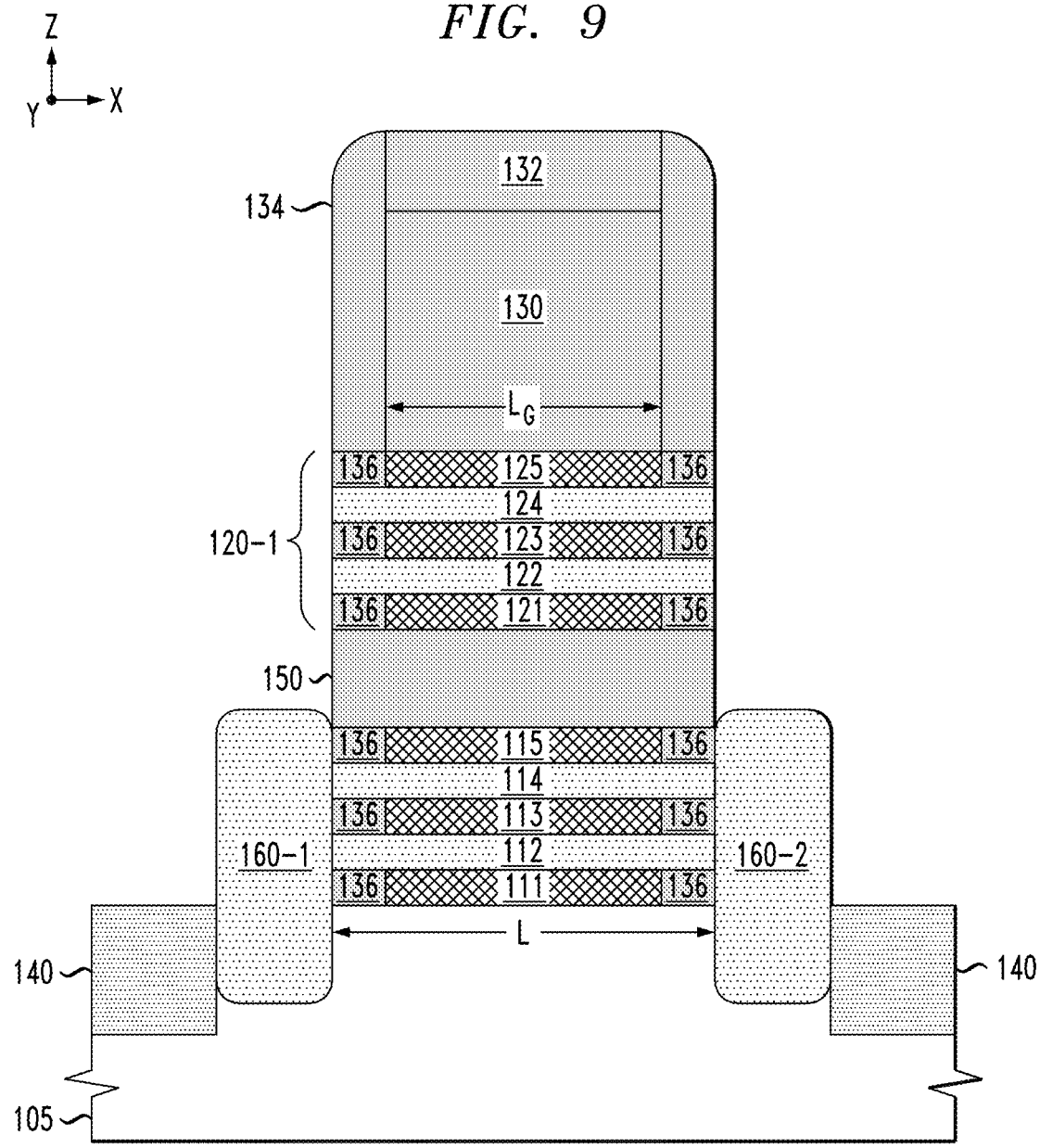

In particular, FIG. 9 is a schematic cross-sectional side view of a next intermediate structure of the semiconductor integrated circuit device, which is constructed by epitaxially growing the first and second source/drain elements 160-1 and 160-2 of the first transistor 101 starting from bottom surfaces of the first and second trenches in the semiconductor substrate 105, according to an exemplary embodiment of the disclosure. The first and second source/drain elements 160-1 and 160-2 of the first transistor 101 are formed by epitaxially growing semiconductor material from the bottom up starting on the exposed <100> crystalline semiconductor surface on the bottom surfaces of the first and second trenches 105-1 and 105-2. With this process, the epitaxial process is configured so that a growth rate of the epitaxial material on the <100> crystalline plane surfaces (starting from the bottom surfaces of the first and second trenches 105-1 and 105-2 of the semiconductor substrate 105) is greater than a growth rate of the epitaxial material on the exposed side surfaces of the active nanosheet channel layers 112, 114, 122, and 124, which have a <110> crystalline plane orientation. In this process, the recessed substrate surface at the bottom of the first and second trenches 105-1 and 105-2 provides a <110> semiconductor surface to seed the growth of the epitaxial material which form the first and second source/drain elements 160-1 and 160-2, wherein the deposited epitaxial semiconductor material takes on the same lattice structure and orientation of the crystalline seed surface.

The first and second source/drain elements 160-1 and 160-2 can be epitaxially grown using known methods such as CVD, MOCVD, LPCVD, MBE, VPE, LPE, MOMBE, RTCVD, LEPD, UHVCVD, APCVD, or other known epitaxial growth techniques which are suitable for the given process flow. The types of epitaxial semiconductor materials that are utilized to form the first and second source/drain elements 160-1 and 160-2 will depend on whether the first transistor 101 is an NFET or PFET. For example, if the first transistor 101 is P-type FET device, and when the active nanosheet channel layers 112 and 114 are formed of epitaxial Si, the first and second source/drain elements 160-1 and 160-2 can be formed of an epitaxial SiGe material (with a relatively high Ge concentration), or a boron-doped SiGe (B:SiGe) epitaxial material, or other suitable epitaxial materials. On the other hand, if the first transistor 101 is an N-type FET device, and when the active nanosheet channel layers 112 and 114 are formed of epitaxial Si, the first and second source/drain elements 160-1 and 160-2 can be formed of carbon-doped silicon (Si:C) epitaxial material, or phosphorus-doped silicon (Si:P) epitaxial material, or other suitable epitaxial materials.

The first and second source/drain elements 160-1 and 160-2 can be doped using known techniques. For example, in some embodiments, the first and second source/drain elements 160-1 and 160-2 are "in-situ" doped during the epitaxial growth process by adding a dopant gas to the source deposition gas (i.e., the Si-containing and/or Ge-containing source gas). Exemplary dopant gases may include a boron (B) or gallium (Ga) containing gas for P-type FETs, or a phosphorus (P) or arsenic (As) containing gas (e.g., such as $PH_3$ or $AsH_3$) for N-type FETs, wherein the concentration of impurity in the gas phase determines its concentration in the epitaxially grown semiconductor material. In other embodiments, an "ex-situ" process may be performed to add dopants into first and second source/drain elements 160-1 and 160-2. For example, an "ex-situ" process can be performed by ion implantation, gas phase doping, plasma doping, plasma immersion ion implantation, cluster doping, infusion doping, liquid phase doping, solid phase doping, or any suitable combination of those techniques.

Moreover, in some embodiments, a thermal anneal process is performed following the epitaxial growth and doping of the first and second source/drain elements 160-1 and 160-2 to cause dopants to be injected into the end portions of the active nanosheet channel layers 112 and 114 that are in contact with the epitaxial semiconductor material of the first and second source/drain elements 160-1 and 160-2. The anneal process effectively results in extending the first and second source/drain elements 160-1 and 160-2 into the semiconductor material of the end portions of the active nanosheet channel layers 112 and 114, which results in a decrease in the parasitic resistance of the nanosheet FET device. In other embodiments, the thermal anneal process is performed in later process (such as after the formation of the high-k gate dielectric layers) so that the same anneal process can serve two purposes at the same time: driving dopants into the nanosheet layers, and improve the reliability of the high-k gate dielectric.

Figure 10:
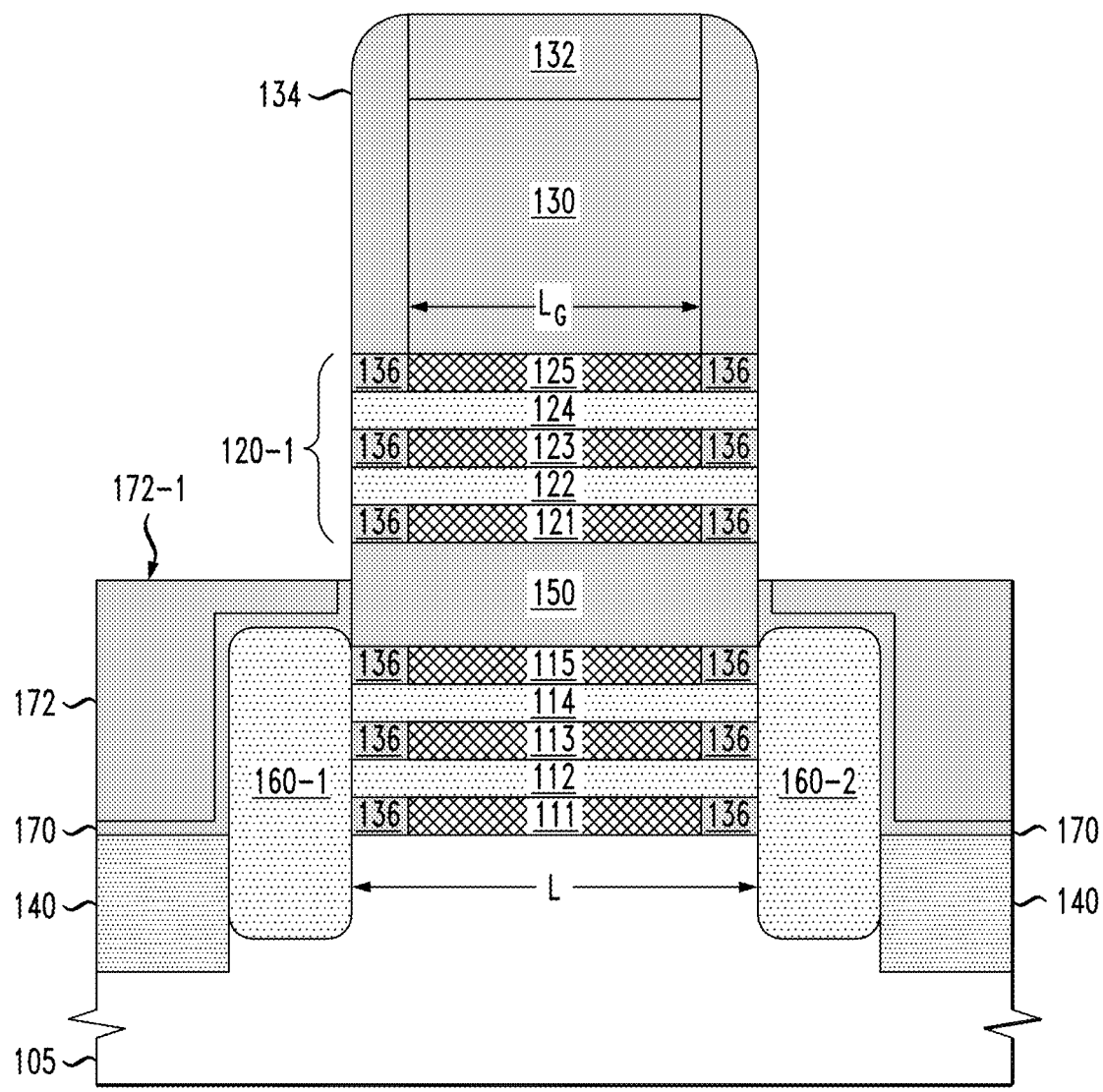

Next, FIG. 10 is a schematic cross-sectional side view of a next intermediate structure of the semiconductor integrated circuit device, which is constructed by depositing and patterning a conformal layer of dielectric material to form the dielectric liner layer 170 over the first and second source/drain elements 160-1 and 160-2 of the first transistor 101, according to an exemplary embodiment of the disclosure. The dielectric liner layer 170 is formed to protect the first and second source/drain elements 160-1 and 160-2 of the first transistor 101 during a subsequent epitaxial process for growing the first and second source/drain elements 162-1 and 162-2 of the second transistor 102. In some embodiments, the dielectric liner layer 170 is formed by a process which comprises depositing a conformal layer of dielectric material over the intermediate structure of FIG. 9, and patterning the conformal layer of dielectric material to remove the dielectric material to from the sidewalls of the second nanosheet channel structure 120-2 and thereby expose ends of the active nanosheet channel layers 122 and 124.

In some embodiments, the dielectric liner layer 170 is formed of dielectric material such as, e.g., SiOC, SiCN, SiN, SiBCN, which has etch selectivity to the dielectric materials of the gate capping layer 132 and the gate sidewall spacer 134. The conformal layer of dielectric material is deposited using any suitable deposition method. Following the conformal deposition process, a planarizing layer 172 (e.g., organic planarizing layer OPL)) is deposited and then recessed down to a level between upper and lower surfaces of the dielectric isolation layer 150, such as shown in FIG. 10, to expose the portion of the conformal dielectric layer above a recessed surface 172-1 of the planarizing layer 172. An etch process is then performed to selectively etch away the exposed portions of the conformal dielectric layer to thereby form the patterned dielectric liner layer 170, and expose the ends of the active nanosheet channel layers 122 and 124 of the second nanosheet channel structure 120-2.

Figure 11:
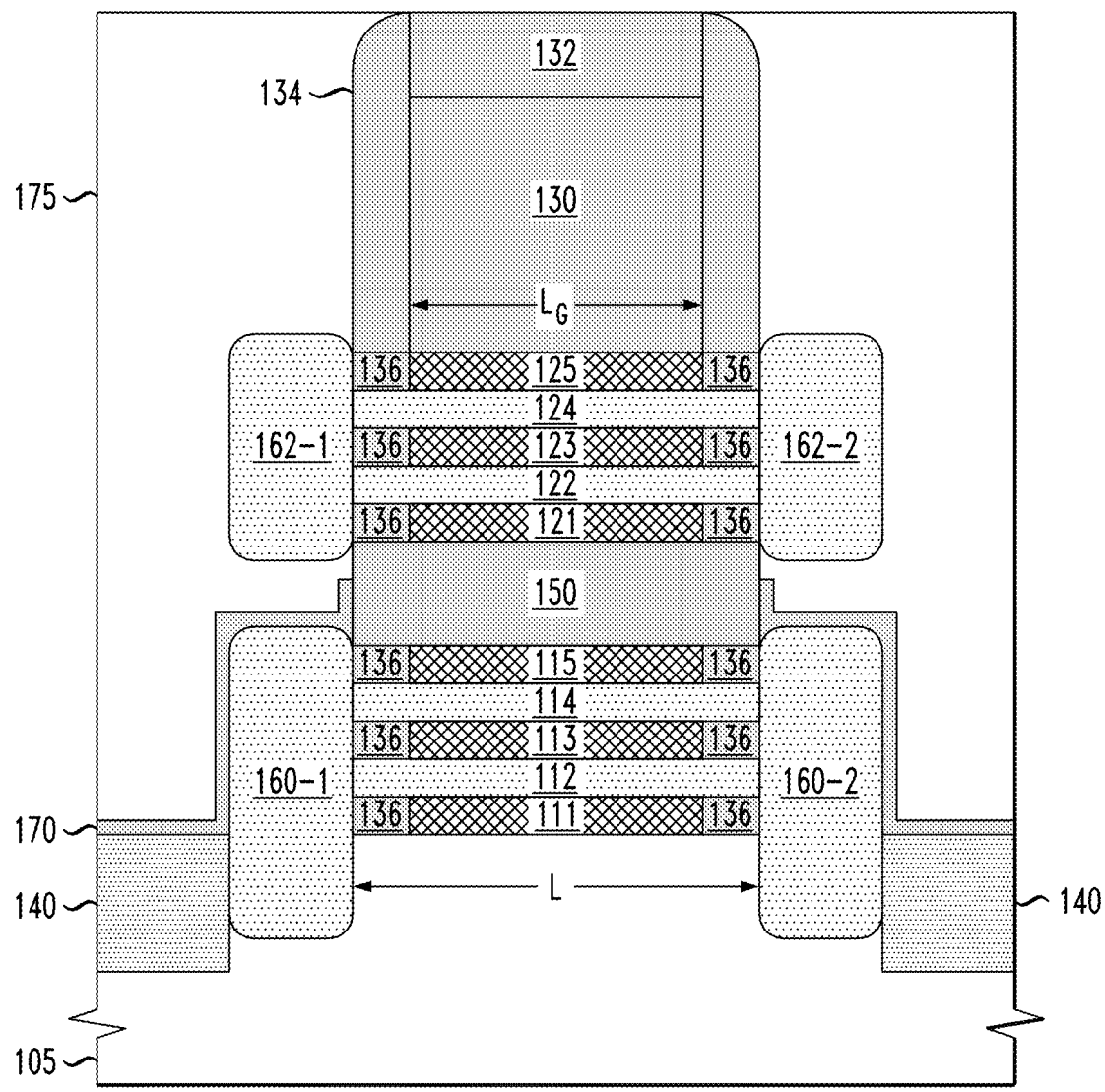

Next, FIG. 11 is a schematic cross-sectional side view of a next intermediate structure of the semiconductor integrated circuit device, which is constructed by epitaxially growing the first and second source/drain elements 162-1 and 162-2 of the second transistor 102, and forming the first insulating layer 175 (e.g., first ILD layer 175) to encapsulate the stacked complementary transistor structure, according to an exemplary embodiment of the disclosure. In some embodiments, the planarizing layer 172 is removed prior to epitaxially growing the first and second source/drain elements 162-1 and 162-2. The first and second source/drain elements 162-1 and 162-2 are formed by epitaxially growing semiconductor material (e.g., epitaxial Si material, SiGe material, carbon-doped silicon (Si:C) material, etc.) on the exposed sidewall surfaces of the active nanosheet channel layers 122 and 124 using materials and techniques which are same or similar to those discussed above for forming the first and second source/drain elements 160-1 and 160-2 of the first transistor 101. In this process, exposed sidewall surfaces of the active nanosheet channel layers 122 and 124 provide a surface area to seed the epitaxial growth of the source/drain elements 162-1 and 162-2. As noted above, the type of epitaxial semiconductor material that is used to form the source/drain elements 162-1 and 162-2 will vary depending on, e.g., the device type (e.g., N-type or P-type) of the second transistor 102. In some embodiments, the epitaxial growth of the semiconductor material is performed so that the epitaxial material merges (in the Z-direction) to form the source/drain elements 162-1 and 162-2.

Following the formation of the first and second source/drain elements 162-1 and 162-2 of the second transistor 102, the process flow continues with forming the first ILD layer 175 to encapsulate the stacked complementary transistor structure in dielectric/insulating material, prior to commencing a replacement metal gate process. In some embodiments, the ILD layer 175 is formed by depositing a blanket layer of dielectric/insulating material over the semiconductor structure and planarizing the layer of dielectric/insulating material down to the gate capping layer 132 to form the first ILD layer 175, as shown schematically shown in FIG. 11.

The first ILD layer 175 may comprise any suitable insulating/dielectric material that is commonly utilized in semiconductor process technologies including, but not limited to, silicon oxide, silicon nitride, silicon oxynitride, SiCOH, SiCH, SiCNH, or other types of silicon-based low-k dielectrics (e.g., k less than about 4.0), porous dielectrics, known ULK (ultra-low-k) dielectric materials (with k less than about 2.5), or any suitable combination of those materials. The dielectric/insulating material of the ILD layer 175 is deposited using known deposition techniques, such as, for example, ALD, CVD, PECVD, PVD, or spin-on deposition. In some embodiments, the layer of dielectric/insulating material is planarized using a standard planarization process such as CMP to remove the overburden dielectric/insulating down to the upper surface of the gate capping layer 132. In some embodiments, a conformal layer of dielectric material (e.g., SiN) is deposited (prior to deposing the insulating material of the ILD layer 175) to form a protective liner layer which covers the first and second source/drain elements 162-1 and 162-2, before blanket depositing the insulating materials to form the ILD layer 175.

Figure 12A:
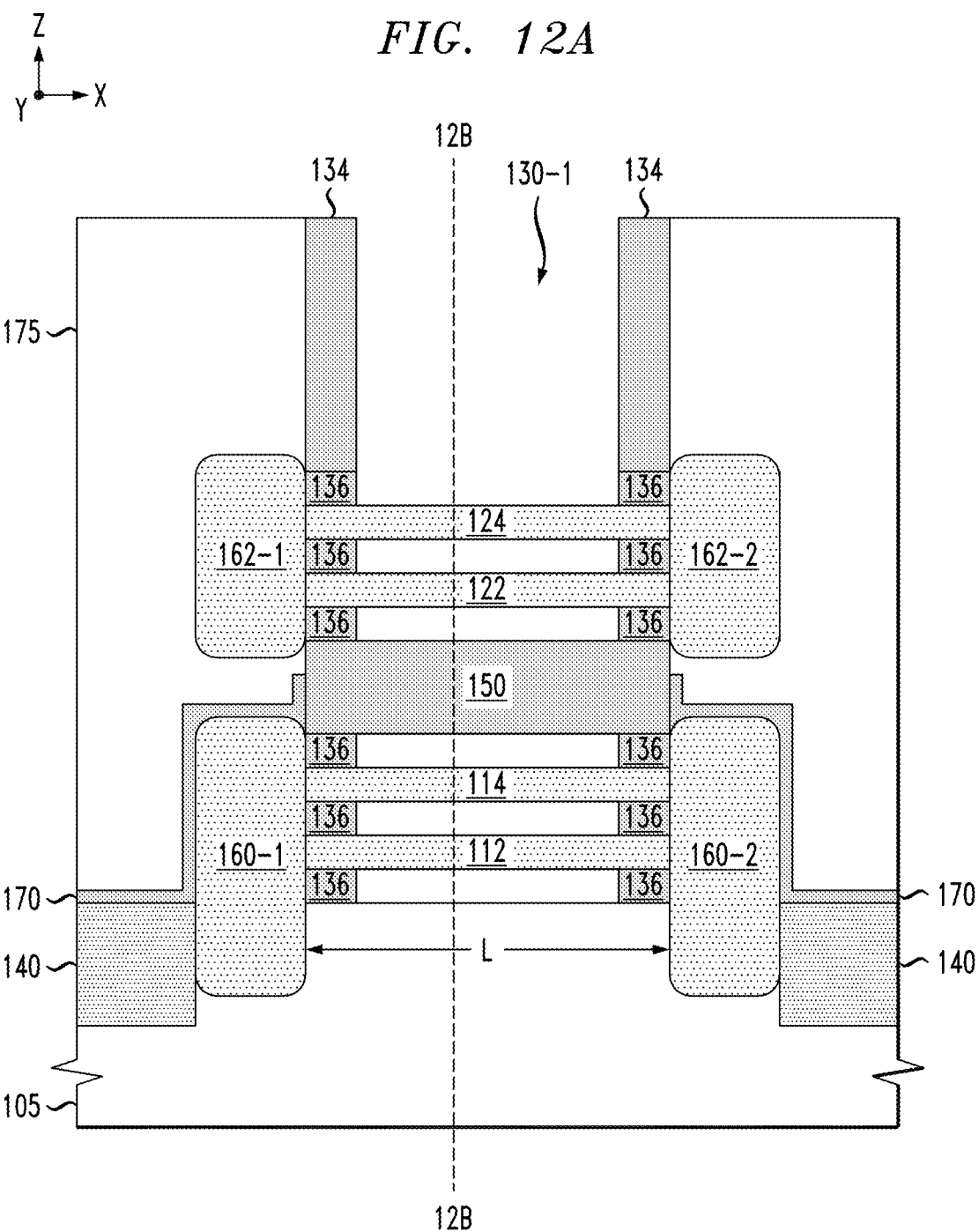
FIGS. 12A and 12B are schematic cross-sectional side views of a next intermediate structure of the semiconductor integrated circuit device, which is constructed by removing the dummy gate structure, removing the sacrificial nanosheet layers to release the active nanosheet channel layers of the first and second nanosheet channel structures of the first and second transistors, to thereby form an open gate region, according to an exemplary embodiment of the disclosure.
Figure 12B:
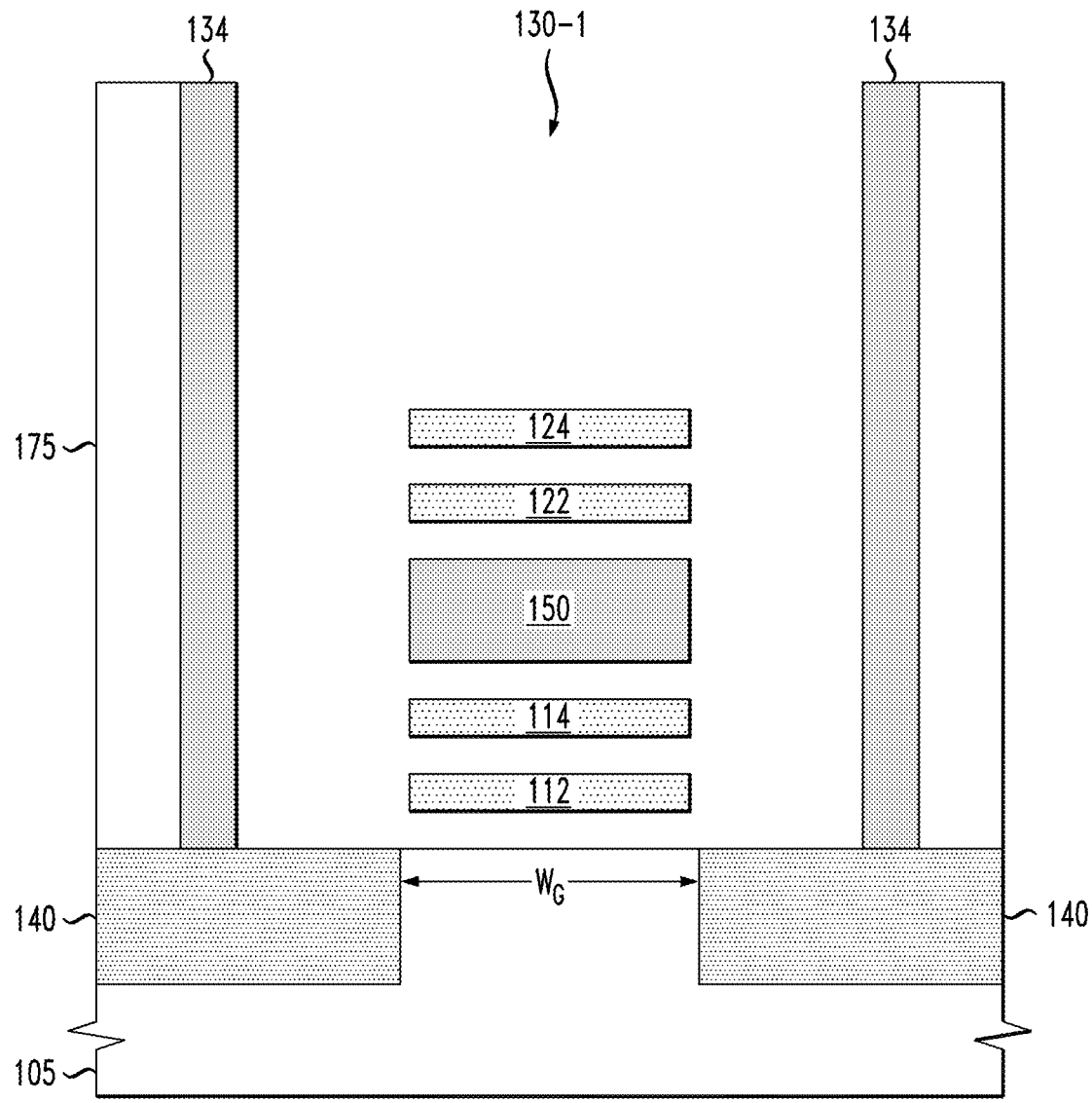

Following the formation of the ILD layer 175, a replacement metal gate process is performed to replace the dummy gate 130 with the metal gate 180 (e.g., HKMG structure), using a process flow as schematically illustrated in FIGS. 12A, 12B, 13A, and 13B. For example, FIGS. 12A and 12B are schematic cross-sectional side views of a next intermediate structure of the semiconductor integrated circuit device, which is constructed by removing the dummy gate 130, removing the sacrificial nanosheet layers 111, 113, 115, 121, 123, and 125 to release the active nanosheet channel layers 112, 114, 122, and 124, and form an open gate region 130-1, according to an exemplary embodiment of the disclosure. FIG. 12A is a schematic cross-sectional side view (X-Z plane) of the resulting intermediate structure, and FIG. 12B is a schematic cross-sectional side view (Y-Z plane) of the resulting semiconductor structure along line 12B-12B shown in FIG. 12A.

In some embodiments, the dummy gate 130 is removed using a process flow which comprises removing the gate capping layer 132 to expose the dummy gate 130, and performing several etch processes to remove the dummy gate 130. More specifically, in some embodiments, the gate capping layer 132 is removed by planarizing (e.g., via CMP) the surface of the semiconductor structure down to the upper surface of the dummy gate 130. In other embodiments, the dielectric material of the gate capping layer 132 (e.g., SiN) can be etched away selective to the materials of the gate sidewall spacer 134 (e.g., SiBCN) and the ILD layer 175 (e.g., silicon oxide) to expose the underlying dummy gate 130. As noted above, in some embodiments where the dummy gate 130 comprises a dummy gate electrode layer (e.g., sacrificial polysilicon layer, or amorphous silicon layer) and a dummy gate oxide layer, the dummy gate electrode and gate oxide layers are etched away using known etching techniques and etch chemistries.

For example, the sacrificial polysilicon material of the gate electrode layer can be removed using a selective dry etch or wet etch process with suitable etch chemistries, including ammonium hydroxide ($NH_4OH$), tetramethylammonium hydroxide (TMAH), or SF6 plasma. The etching of the dummy poly gate layer is selective to, e.g., the dummy gate oxide layer, to thereby protect the active nanosheet channel layers 112, 114, 122, and 124 from being etched during the poly etch process. After the polysilicon material is removed, an oxide etch process is performed to etch away the dummy gate oxide layer selective to, e.g., the active nanosheet channel layers 112, 114, 122, and 124. In this manner, the sacrificial materials (e.g., dummy polysilicon and oxide layers) of the dummy gate 130 can be etched away without damaging the active nanosheet channel layers 112, 114, 122, and 124.

After removing the dummy gate 130, an etch process is performed to selectively etch away the sacrificial nanosheet layers 111, 113, 115, 121, 123, and 125 to release the active nanosheet channel layers 112, 114, 122, and 124 of the first and second nanosheet channel structures 110-1 and 120-1, and thereby allow the open gate region 130-1 to extend into spaces between and adjacent to the active nanosheet channel layers 112, 114, 122, and 124. The sacrificial nanosheet layers 111, 113, 115, 121, 123, and 125 (e.g., epitaxial SiGe layers) can be etched away selective to the active nanosheet channel layers 112, 114, 122, and 124 (e.g., epitaxial Si layers). In some embodiments, SiGe material of the sacrificial nanosheet layers 111, 113, 115, 121, 123, and 125 can be selectively etched (with high etch selectivity) using a gas phase HCl (hydrochloric acid) or wet etch solution containing hydrogen peroxide ($H_2O_2$) to etch the SiGe material of the sacrificial nanosheet layers 111, 113, 115, 121, 123, and 125 selective to the Si material of the active nanosheet channel layers 112, 114, 122, and 124. The gas phase HCl (hydrochloric acid) provides high etch selectivity when, for example, the active nanosheet channel layers 112, 114, 122, and 124 are formed of epitaxial Si or epitaxial SiGe with a lower Ge concentration than the epitaxial SiGe material of the sacrificial nanosheet layers 111, 113, 115, 121, 123, and 125.

Figure 13A:
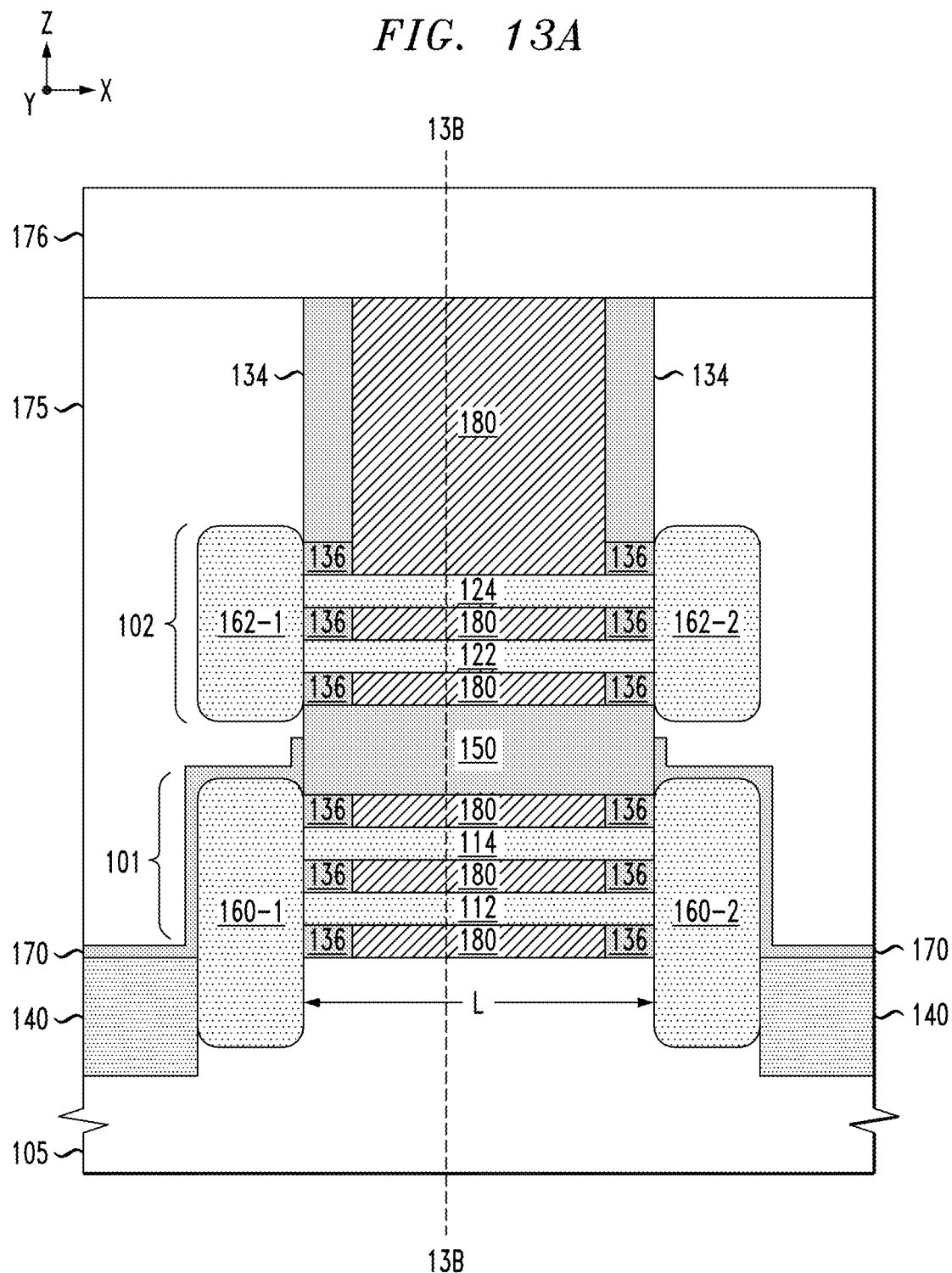
FIGS. 13A and 13B are schematic cross-sectional side views of a next intermediate structure of the semiconductor integrated circuit device, which is formed by forming a metal gate structure, and forming a second insulating layer over the first insulating layer and the metal gate structure, according to an exemplary embodiment of the disclosure.
Figure 13B:
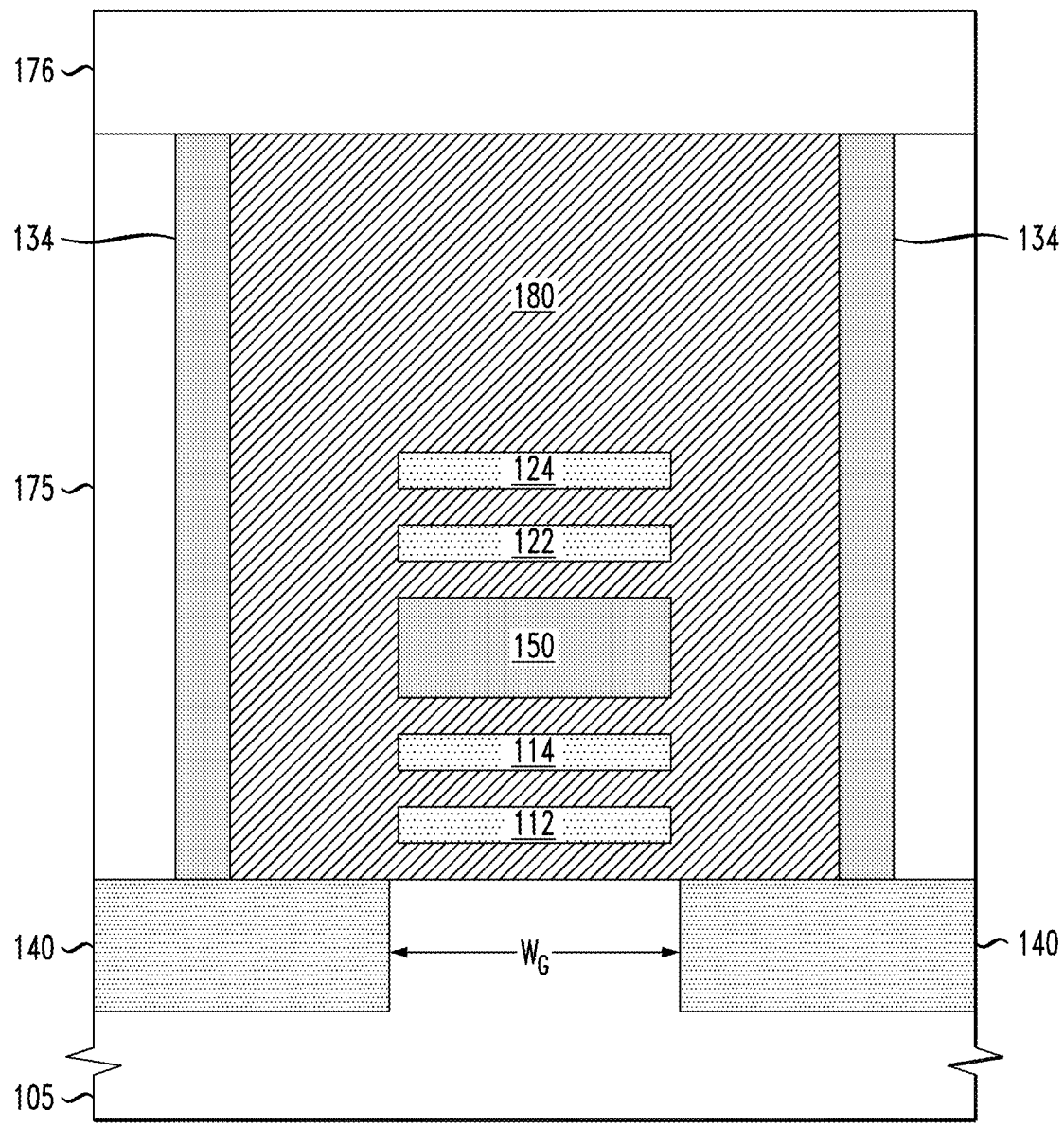

Next, FIGS. 13A and 13B are schematic cross-sectional side views of a next intermediate structure of the semiconductor integrated circuit device, which is formed by forming the metal gate 180, and forming the second ILD layer 176, according to an exemplary embodiment of the disclosure. FIG. 13A is a schematic cross-sectional side view (X-Z plane) of the resulting intermediate structure, and FIG. 13B is a schematic cross-sectional side view (Y-Z plane) of the resulting semiconductor structure along line 13B-13B shown in FIG. 13A. In some embodiments, the metal gate 180 comprises a HKMG structure which is formed by a process which comprises (i) depositing one or more conformal layers of high-k gate dielectric material over the exposed surfaces of the semiconductor structure to conformally cover the surfaces of the active nanosheet channel layers 112, 114, 122, and 124, and (ii) depositing one or more layers of work function metal to cover the high-k gate dielectric and fill the reaming spaces in the open gate region 130-1 to form a metal gate electrode layer.

In some embodiments, the high-k gate dielectric layer is preferably formed of a high-k dielectric material having a dielectric constant of about 3.9 or greater. For example, the gate dielectric material can include but is not limited to metal oxides such as hafnium oxide, hafnium silicon oxide, hafnium silicon oxynitride, hafnium zirconium oxide, and nitride films thereof. In other embodiments, the high-k dielectric may comprise lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k dielectric material may further include dopants such as lanthanum, aluminum. In one embodiment of the invention, the conformal high-k gate dielectric layer is formed with a thickness in a range of about 0.5 nm to about 2.0 nm, which will vary depending on the target application. The conformal layer of high-k gate dielectric material is deposited using known methods such as ALD, for example, which allows for high conformality of the gate dielectric material.

As is known in the art, the use of high-k gate dielectric materials can be problematic in that such dielectric materials typically do not interface well with silicon layers. For example, high-k gate dielectric materials do not passivate a silicon surface, which results in a large number of interface traps and charges and other issues which can degrade device performance. As such, in one exemplary embodiment, before depositing the high-k dielectric material to form the high-k gate dielectric layer, a channel pre-clean process is performed to clean the exposed silicon surfaces of the active nanosheet channel layers 112, 114, 122, and 124, which is then followed by an oxidation process to grow ultra-thin interfacial silicon oxide layers on the exposed surfaces of the active nanosheet channel layers 112, 114, 122, and 124. It is to be understood that the formation of the interfacial silicon oxide layers is an optional step and that in other embodiments of the invention, a high-k dielectric material of the HKMG structures can be formed on the exposed silicon surfaces of the active nanosheet channel layers without initially forming the thin interfacial oxide layers.

In some embodiments, the interfacial silicon oxide layers are formed using a chemical oxidation process in an ozonated deionized water comprising ozone, and a suitable oxidation temperature, ozone concentration in the deionized water, and chemical oxidation process time to form thin interfacial silicon oxide layers. The interfacial layers are formed by oxidizing the exposed silicon surfaces of the active nanosheet channel layers 112, 114, 122, and 124 to form thin interfacial silicon oxide layers with a thickness in a range of about 5 angstroms to about 10 angstroms (i.e., about 0.5 nm to about 1 nm).

In some embodiments, the metal gate electrode comprises one or more work function metal layers which are conformally deposited over the high-k gate dielectric layers. The work function metal layer(s) may comprise one or more types of metallic materials, including, but not limited to, titanium nitride (TiN), tantalum nitride (TaN), and an Al-containing alloy (e.g., TiAlC, TiAl, and AlC, or nitrided alloys thereof). In other embodiments, the work function metal layer(s) may comprise a metallic material which comprises a composition or alloy of Zr, W, Hf, Ti, Al, Ru, Pa, ZrAl, WAl, TaAl, HfAl, TaC, TiC, TaMgC, and other types, compositions, or alloys of work function metals that are commonly used to obtain target work functions for the FET devices. The work function metal layers are conformally deposited using known methods such as ALD, CVD, etc., which allow for high conformality of the deposited work function metal layers.

In some embodiments, the work function metal layers completely fill the spaces above and below the active nanosheet channel layers 112, 114, 122, and 124. Indeed, in instances where the initial spacing between the active nanosheet channel layers 112, 114, 122, and 124 is relatively small (e.g., 7 nm to 10 nm), after formation of the high-k dielectric layer, the conformal deposition of a stack of two or more work function metal layers can result in filling (i.e., pinch-off) the spaces above and below the active nanosheet channel layers 112, 114, 122, and 124 such that the spaces are filled with gate dielectric material and work function metal. This is sufficient for short-channel length nanosheet FET devices where LG is about 15 nm or less.

Furthermore, in some embodiments, the remaining portions of the open gate region 130-1 above the active nanosheet channel layer 124 can be filled with work function metal by continuing the deposition process for the last deposited work function metal layer until the open gate region 130-1 above the active nanosheet channel layer 124 is completely filled with the work function metal layer. In other embodiments, the remaining portion of the open gate region 130-1 can be filled with a low-resistance metallic material such as tungsten, ruthenium, cobalt, copper, aluminum, etc. to form a metallic gate electrode apart from the work function metal.

Following the deposition of the dielectric and metallic materials that form the metal gate 180 (e.g., HKMG structure), a CMP process is performed to polish the surface of the semiconductor structure down to the ILD layer 175, thereby removing overburden portions of the gate dielectric, work function, and gate electrode layers on the ILD layer 175. Following formation of metal gate 180, the second ILD layer 176 is formed on the first ILD layer 175 to cover the exposed upper surface of the metal gate 180. In some embodiments, the second ILD layer 176 is formed of the same or similar material as the first ILD layer 175.

In some embodiments, a gate capping layer can be formed prior to forming the second ILD layer, wherein the gate capping layer covers the upper surface of the metal gate 180. For example, following the formation of the metal gate 180, an etch process can be performed to recess an upper surface of the metal gate 180 down to a target level below the upper surface of the ILD layer 175. A layer of dielectric material is then deposited over the surface of the semiconductor device structure to fill the area above the recessed surface of the metal gate 180 with dielectric material, and the semiconductor device structure is planarized down to the surface of the ILD layer 175 to remove the overburden dielectric material, and thereby form the gate capping layer. The gate capping layer can be formed of a dielectric material such as SiN or SiBCN, etc. The second ILD layer 176 is then formed to cover the first ILD layer 175 and the gate capping layer.

Figure 14:
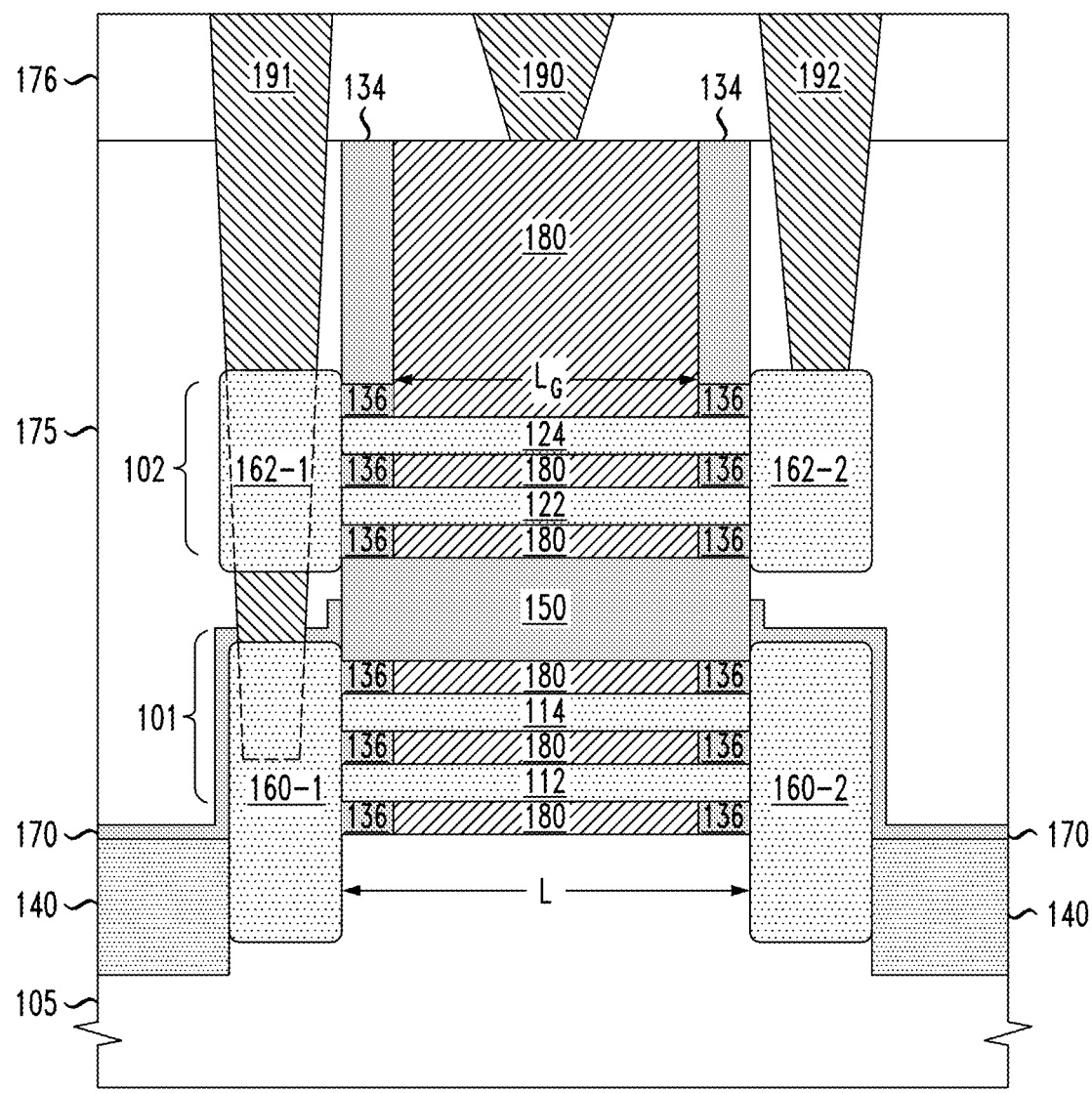

Next, FIG. 14 is a schematic cross-sectional side view of a next intermediate structure of the semiconductor integrated circuit device, which is constructed by forming frontside gate and source/drain contacts to the stacked complementary FET structure, according to an exemplary embodiment of the disclosure. More specifically, FIG. 14 schematically illustrates a next stage of the fabrication process in which the gate contact 190 is formed in contact with the metal gate 180, the source/drain contact 191 is formed to contact the first source/drain elements 160-1 and 162-1 of the first and second transistors 101 and 102, and the source/drain contact 192 is formed to contact the second source/drain element 162-2 of the second transistor 102. In some embodiments, the contacts 190, 191, and 192 are formed using any suitable middle-of-the-line (MOL) process module and materials to form MOL contacts.

For example, the contacts 190, 191, and 192 are formed by a process which comprises patterning/etching the first and second ILD layers 175 and 176 to (i) form a via opening in the ILD layer 176 down to the metal gate 180, (ii) form a via opening in the ILD layers 175 and 176 to expose portions of the first source/drain elements 160-1 and 162-1 of the first and second transistors 101 and 102, and (iii) form a via opening in the ILD layers 175 and 176 to expose a portion of the second source/drain element 162-2 of the second transistor 102, and then filling the via openings with metallic material to form the gate contact 190 and the source/drain contacts 191 and 192. In some embodiments, the etching process comprises a first etch process to etch the ILD layers 175 and 176 selective to the materials of the metal gate 180 and the epitaxial source/drain regions to form the via openings, followed by a second etch process to selectively etch away the exposed portions of the dielectric liner layers (e.g., dielectric liner layer 170) in the via openings, which were previously formed on the epitaxial source/drain elements.

In some embodiments, prior to forming the contacts 190, 191, and 192, a salicidation process is performed to form silicide contact layers on the exposed surfaces of epitaxial source/drain elements in the via openings prior to filling the via openings with metallic material. In general, a salicide process involves the reaction of thin metal film with epitaxial material of the source/drain elements to form metal silicide contacts through an annealing process.

In some embodiments, the contacts 190, 191, and 192 are formed by depositing a thin conformal diffusion barrier layer to line the surfaces of the via openings, followed by depositing metallic material over the diffusion barrier layer to fill the via openings. In some embodiments, the metallic material comprises any suitable material for forming MOL contacts including, but not limited to, tungsten or cobalt. The diffusion barrier layer prohibits the diffusion of metallic material of the contacts into the surrounding material of the ILD layers 175 and 176, as well as preventing out diffusion of, e.g., oxygen from the ILD layers 175 and 176 which could oxidize the metallic material that is used to form the contacts 190, 191, and 192. For example, a diffusion barrier layer can be thin conformal layer titanium (Ti), titanium nitride (TiN), tantalum (Ta), tantalum nitride (TaN), tungsten (W), tungsten nitride (WN), or any other material that is suitable for use as a diffusion barrier to prohibit out diffusion of the metallic material which forms the MOL contacts.

Figure 15:
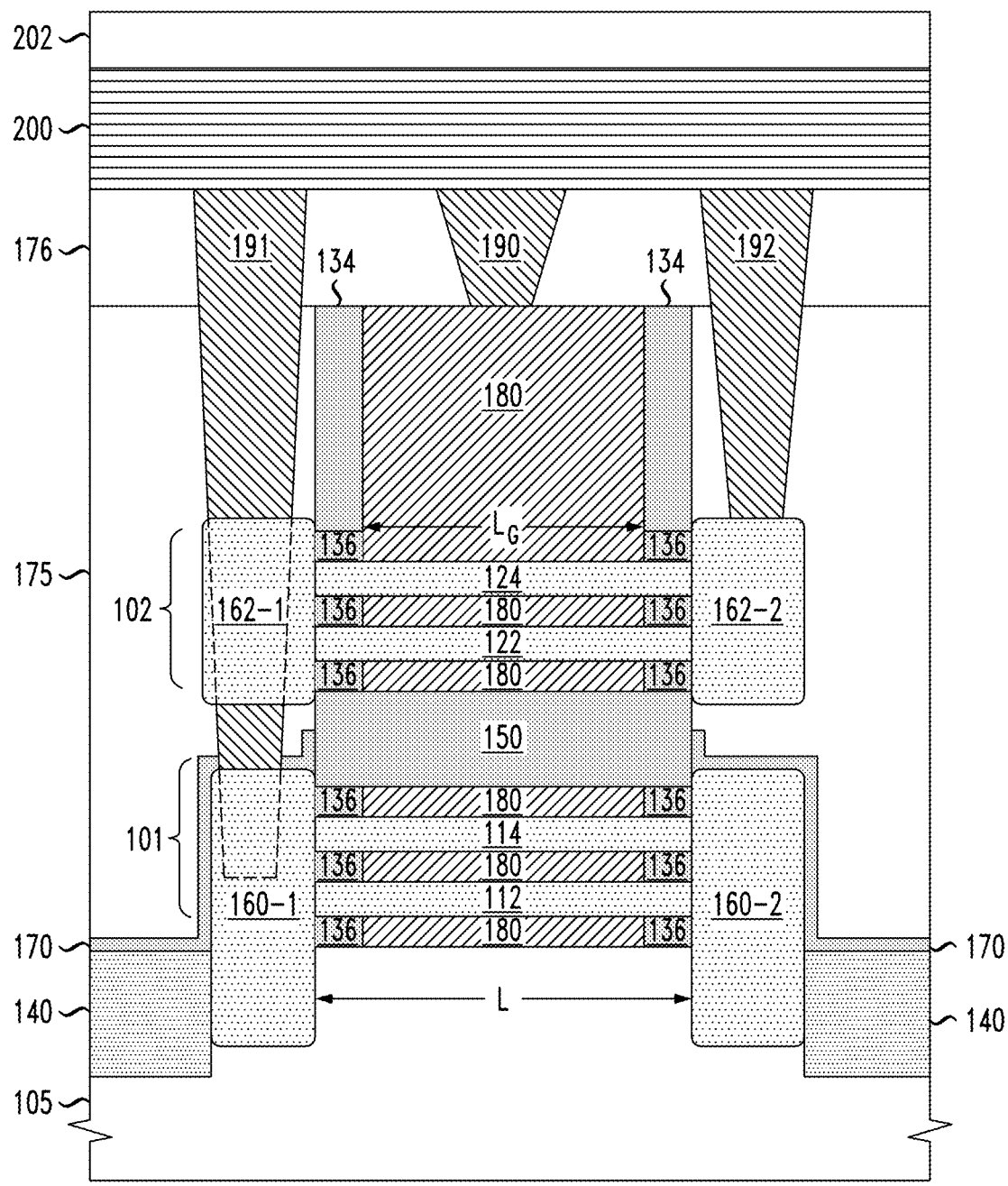

Next, FIG. 15 is a schematic cross-sectional side view of a next intermediate structure of the semiconductor integrated circuit device, which is constructed by forming a first interconnect structure (e.g., BEOL interconnect structure) on a frontside of the intermediate structure of FIG. 14, and bonding a handler substrate to the first interconnect structure, according to an exemplary embodiment of the disclosure. More specifically, FIG. 15 schematically illustrates a next stage of the fabrication process in which the first interconnect structure 200 is formed on the ILD layer 175, and a handler substrate 202 is temporarily bonded to first interconnect structure 200.

As noted above, in some embodiments, the first interconnect structure 200 comprises a BEOL interconnect structure which comprises multiple levels of metal lines and inter-level metal vias embedded in multiple layers of dielectric material, which form a network of interconnect structures and wiring that is configured to (i) connect various integrated circuit components and devices that are fabricated as part of a front-end-of-line (FEOL) layer of the semiconductor integrated circuit, (ii) provide I/O connections between the FEOL devices and external components, and to (iii) provide a power distribution network which distributes positive and negative power supply voltage to the active components. The BEOL metallization comprises horizontal wiring, interconnects, pads, etc., as well as vertical wiring in the form of conductive vias that form connections between different interconnect levels of the BEOL interconnect structure. The BEOL interconnect structure provides connections to/between the MOL contacts, and other active or passive devices that are formed as part of the FEOL layer. The BEOL interconnect structure can be fabricated using any suitable BEOL process module, the details of which are well known to those of ordinary skill in the art.

The handler substrate 202 (e.g., handler wafer) is bonded to the first interconnect structure 200 to facilitate backside processing, as discussed in further detail below in conjunction with FIGS. 16 and 17. The handler substrate 202 is temporarily bonded to the first interconnect structure 200 using a polymeric bonding technique (e.g., contact bonding or thermo-compression bonding), or other suitable techniques. The handler substrate 202 may comprise a semiconductor substrate or a glass substrate, or any type of substrate material which is suitable for the given application.

Figure 16:
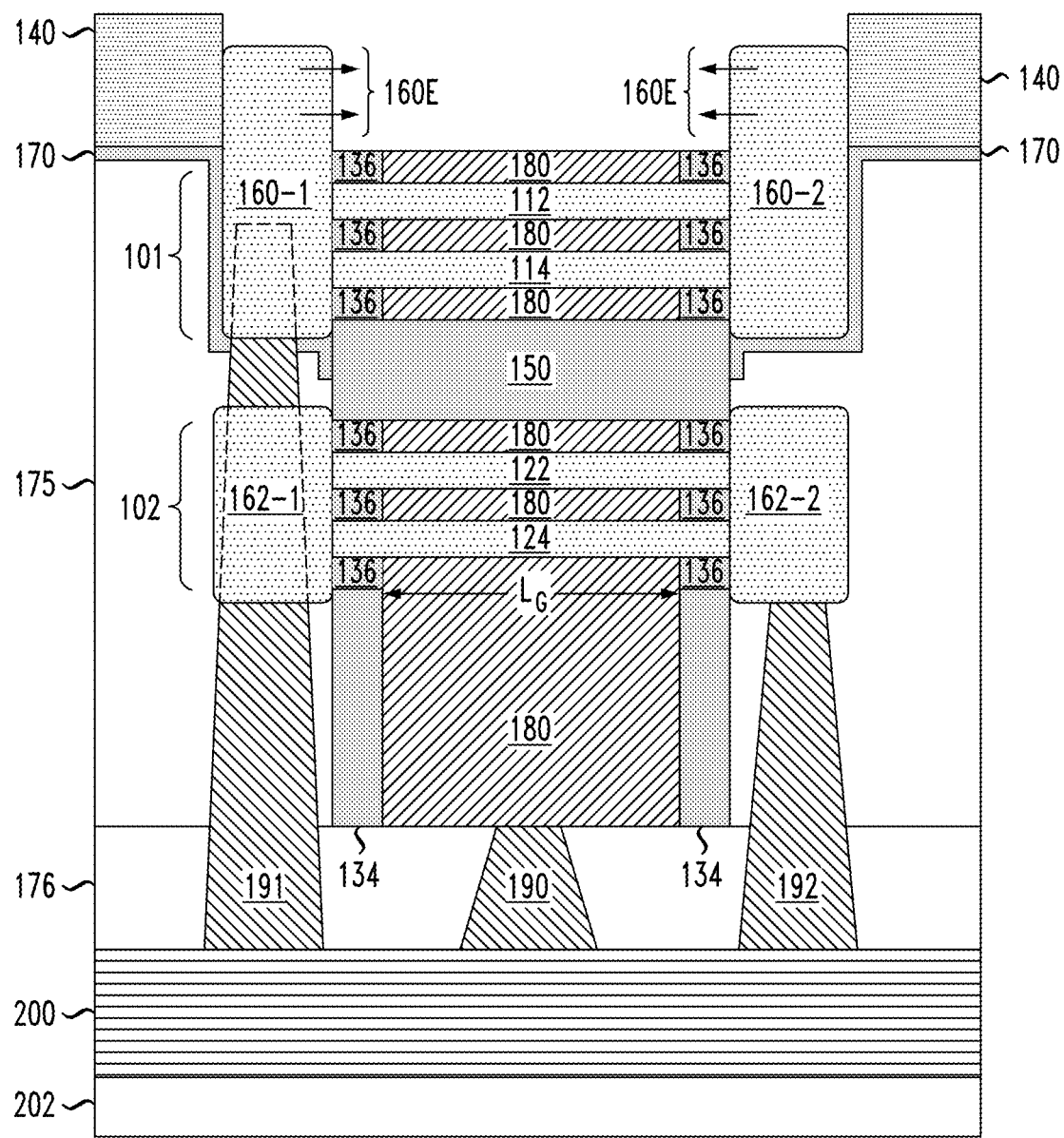

Next, FIG. 16 is a schematic cross-sectional side view of a next intermediate structure of the semiconductor integrated circuit device, which is constructed by backside processing the intermediate structure of FIG. 14 to remove the semiconductor substrate 105, according to an exemplary embodiment of the disclosure. More specifically, FIG. 16 schematically illustrates a next stage of the fabrication process in which the semiconductor substrate 105 is removed to expose a bottom side of the first transistor 101 and the extended portions 160E of the first and second source/drain elements 160-1 and 160-2 of the first transistor 101. The semiconductor substrate 105 is removed using known techniques such as mechanical grinding, polishing, etching, or any combination of grinding, polishing, and etching.

For example, a backside grinding/polishing process is first performed to remove a bulk of the semiconductor substrate 105 down to the STI layer 140. An etch process is then performed to selectively etch the remaining portion of the semiconductor substrate 105 to expose the bottom side of the first transistor 101 and the extended portions 160E of the first and second source/drain elements 160-1 and 160-2. The backside etch process to remove the semiconductor substrate 105 is configured to be selective to the materials of the STI layer 140, the epitaxial material of the source/drain elements 160-1 and 160-2 of the first transistor 101, and the metal gate 180. In some embodiments, the backside selective etch process is performed using an aqueous ammonia etching solution.

As schematically shown in FIG. 16, etching away the semiconductor substrate 105 serves to release the extended portions 160E of the first and second source/drain elements 160-1 and 160-2 of the first transistor 101, wherein releasing the extended portions 160E of the first and second source/drain elements 160-1 and 160-2 results in strain being applied to the active nanosheet channel layers 112 and 114 of the first transistor 101. In some embodiments, as schematically illustrated in FIG. 16, when the first transistor 101 is a PFET and the source/drain elements 160-1 and 160-2 are formed of, e.g., epitaxial SiGe, the releasing of the extended portions 160E allows the epitaxial material of the source/drain elements 160-1 and 160-2 to further relax (e.g., expand), which results in a compressive strain (as schematically indicated by the direction of the arrows in FIG. 16) being applied to the active nanosheet channel layers 112 and 114 of the first transistor 101. The compressive strain applied to the active nanosheet channel layers 112 and 114 of the first transistor 101 serves to enhance the performance of the first transistor 101 when the first transistor 101 is a PFET.

On the other hand, when the first transistor 101 is an NFET and the first and second source/drain elements 160-1 and 160-2 are formed of, e.g., epitaxial SiP material, the releasing of the extended portions 160E allows the epitaxial material of the first and second source/drain elements 160-1 and 160-2 to further relax (e.g., contract), which results in a tensile strain (opposite the direction of the arrows shown in FIG. 16) being applied to the active nanosheet channel layers 112 and 114 of the first transistor 101. The tensile strain applied to the active nanosheet channel layers 112 and 114 of the first transistor 101 serves to enhance the performance of the first transistor 101 when the first transistor 101 is an NFET.

Figure 17:
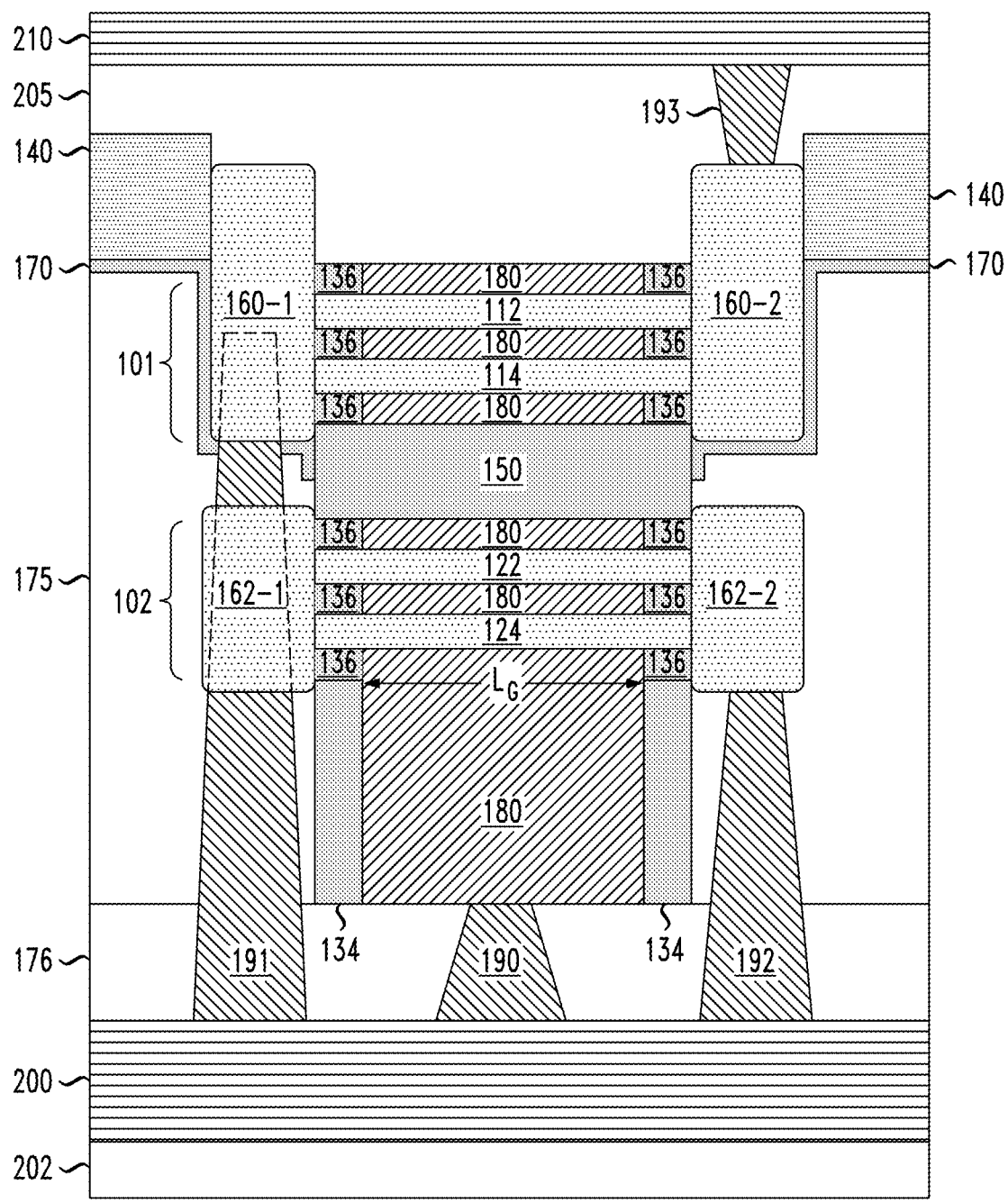

Next, FIG. 17 is a schematic cross-sectional side view of a next intermediate structure of the semiconductor integrated circuit device, which is constructed by backside processing the intermediate structure of FIG. 16 to form a dielectric layer, backside contacts, and backside interconnect structure, according to an exemplary embodiment of the disclosure. to remove the semiconductor substrate 105, according to an exemplary embodiment of the disclosure. More specifically, FIG. 17 schematically illustrates a next stage of the fabrication process which involves forming the backside insulating layer 205, forming the source/drain contact 193, and forming the second (backside) interconnect structure 210. In some embodiments, the backside insulating layer 205 is formed by a process which comprises (i) depositing a conformal layer of dielectric material (e.g., SiN) to form a dielectric liner on the exposed surfaces of the source/drain elements 160-1 and 160-2 of the first transistor 101 and the exposed bottom surface of the metal gate 180, and (ii) depositing and planarizing a layer of insulating material, to thereby form the backside insulating layer 205. In some embodiments, the backside insulating layer 205 is formed of the same or similar materials (e.g., silicon oxide, low-k dielectric material, etc.) as the ILD layers 175 and 176.

Next, the source/drain contact 193 is formed in the backside insulating layer 205 using techniques and materials which are the same or similar to the MOL processing techniques as discussed above for fabricating the frontside contacts 190, 191, and 192. The second interconnect structure 210 is formed on the backside insulating layer 205 using, e.g., BEOL fabrication techniques. In some embodiments, the second interconnect structure 210 is configured to distribute positive and/or negative power supply voltage active components of the FEOL layer. In some embodiments, the second interconnect structure 210 is further configured to enable backside signal I/O to devices of the FEOL layer in addition to the signal I/O provided by the first (BEOL) interconnect structure 200. Following formation of the second interconnect structure 210, the handler substrate 202 is removed using known techniques, resulting in the semiconductor integrated circuit device 100 as shown in FIG. 1.

Figure 18:
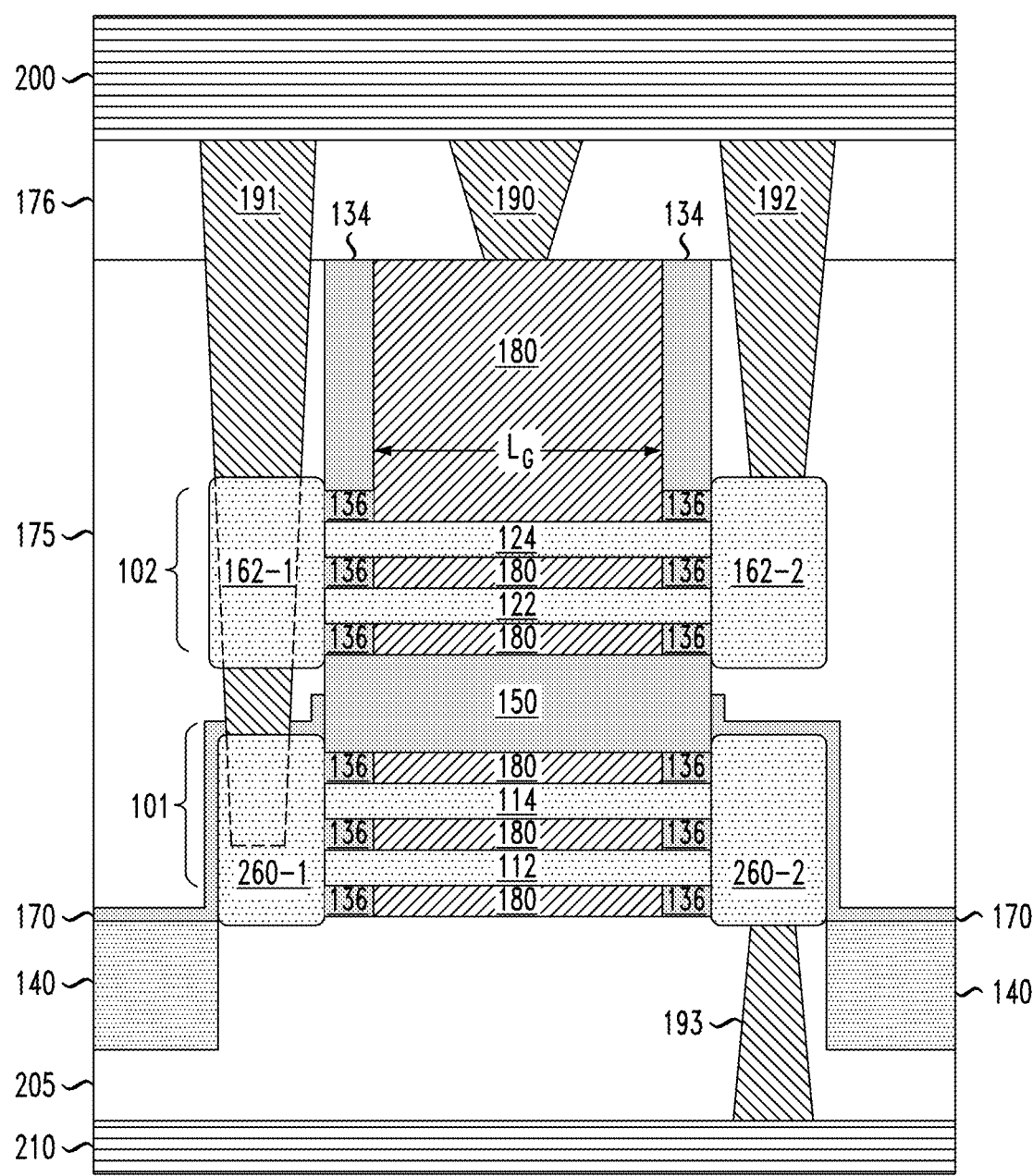
FIG. 18 is schematic cross-sectional side view of a semiconductor integrated circuit device comprising a stacked complementary transistor structure, according to another exemplary embodiment of the disclosure.

FIG. 18 is schematic cross-sectional side view of a semiconductor integrated circuit device comprising a stacked complementary transistor structure, according to another exemplary embodiment of the disclosure. In particular, FIG. 18 is schematic cross-sectional side view of a semiconductor integrated circuit device 100-1 which is similar to the semiconductor integrated circuit device 100 of FIG. 1, except that the first transistor 101 in FIG. 18 comprises first and second source/drain elements 260-1 and 260-2 which do not have extended portions that extend into the backside insulating layer 205. The process of fabricating the semiconductor integrated circuit device 100-1 is similar to the process shown in FIGS. 2-17, except that the modified process would omit the trench formation process as shown in FIG. 8, and the epitaxial process shown in FIG. 9 would start on the exposed, but non-recessed, surface of the semiconductor substrate 105 in the S/D regions to grow the first and second source/drain elements 260-1 and 260-2 shown in FIG. 18.

It is to be understood that the techniques disclose herein can be implemented for other stacked complementary transistor structures. For example, while the exemplary embodiments disclosed herein illustrate stacked complementary transistor structures with a common metal gate structure, the techniques disclosed herein can be implemented in conjunction with stacked complementary transistor structures in which the first and second transistor have separate gate structures to enable independent gate control of the first and second transistors.

Moreover, the exemplary embodiments discussed herein disclose the use of the sacrificial nanosheet layer 116 (e.g., FIG. 2) formed of, e.g., epitaxial SiGe (with Ge concentration of 50%) as a placeholder to enable epitaxy growth of the second nanosheet stack 120 for the second transistor 102, wherein the sacrificial nanosheet layer 116 is subsequently replaced with a dielectric to form the dielectric isolation layer 150 between the first and second transistors 101 and 102. In an alternate embodiment, the first nanosheet stack 110 can be epitaxially grown on a first semiconductor substrate, and the second nanosheet stack 120 can be epitaxially grown on a second semiconductor substrate. A layer of dielectric material can be deposited on either the first nanosheet tack 110 or the second nanosheet stack 120, followed by a wafer bonding and thinning process module to form the first and second nanosheet stack structures 110 and 120 with a dielectric layer disposed between the first and second nanosheet stacks 110 and 120. This alternate process would eliminate the need to perform the process as schematically shown in FIGS. 4B and 5 where the remaining portion of the sacrificial nanosheet layer 116 between the first and second nanosheet channel structures 110-1 and 120-2 (as shown in FIG. 4B) is etched away and replaced with the dielectric isolation layer 150 (as shown in FIG. 5).

It is to be understood that the exemplary methods discussed herein for fabricating stacked complementary transistor structures can be readily incorporated within semiconductor processing flows, semiconductor devices, and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit as disclosed herein can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the exemplary embodiments described herein. Given the teachings of the invention provided herein, one of ordinary skill in the art will be able to contemplate other implementations and applications of the exemplary techniques disclosed herein.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

What is claimed is:

1. A device comprising:
a first interconnect structure;
a second interconnect structure;
a stacked complementary transistor structure disposed between the first and second interconnect structures, wherein the stacked complementary transistor structure comprises a first transistor of a first type, and a second transistor of a second type which is opposite the first type;
a first contact connecting a first source/drain element of the first transistor to the first interconnect structure; and
a second contact connecting a first source/drain element of the second transistor to the second interconnect structure;
wherein the first and second contacts are disposed in alignment with each other; and
wherein the first source/drain element of the second transistor comprises an extended portion which extends beyond a gate of the second transistor towards the second interconnect structure.

2. The device of claim 1, further comprising a third contact commonly connecting second source/drain elements of the first and second transistors to the first interconnect structure.

3. The device of claim 1, wherein the stacked complementary transistor structure comprises a common metal gate structure which is shared by the first and second transistors.

4. The device of claim 1, wherein the first and second transistors comprise gate-all-around field-effect transistors.

5. The device of claim 1, wherein the stacked complementary transistor structure comprises a complementary inverter cell.

6. The device of claim 1, wherein the first interconnect structure comprises a signal network and a power distribution network.

7. The device of claim 1, wherein the second interconnect structure comprises a power distribution network.

8. The device of claim 1, wherein the first transistor is a P-type transistor and the second transistor is an N-type transistor, or wherein the first transistor is an N-type transistor and the second transistor is a P-type transistor.

9. A device comprising:
a first interconnect structure;
a second interconnect structure;
a stacked complementary transistor structure disposed between the first and second interconnect structures, wherein the stacked complementary transistor structure comprises a first transistor of a first type, and a second transistor of a second type which is opposite the first type;
an insulating layer disposed between the stacked complementary transistor structure and the second interconnect structure, wherein first and second source/drain elements of the second transistor each comprise an extended portion which extends beyond a gate of the second transistor into the second insulating layer;
a first contact connecting a first source/drain element of the first transistor to the first interconnect structure; and
a second contact coupled to the extended portion of the first source/drain element of the second transistor to connect the first source/drain element of the second transistor to the second interconnect structure;
wherein the first and second contacts are disposed in alignment with each other.

10. The device of claim 9, wherein:
the second transistor is a P-type transistor; and
the first and second source/drain elements of the second transistor comprise an epitaxial semiconductor material which is configured to apply a compressive strain on an active channel of the second transistor.

11. The device of claim 9, wherein:
the second transistor is an N-type transistor; and
the first and second source/drain elements of the second transistor comprise an epitaxial semiconductor material which is configured to apply a tensile strain on an active channel of the second transistor.

12. The device of claim 9, wherein the stacked complementary transistor structure comprises a common metal gate structure which is shared by the first and second transistors.

13. The device of claim 9, wherein the first and second transistors comprise gate-all-around field-effect transistors.

14. The device of claim 9, wherein the stacked complementary transistor structure comprises a complementary inverter cell.

15. The device of claim 9, wherein the first interconnect structure comprises a signal network and a power distribution network.

16. The device of claim 9, wherein the second interconnect structure comprises a power distribution network.

17. A device comprising:
a first interconnect structure;
a second interconnect structure;
a complementary inverter comprising a stacked complementary transistor structure disposed between the first and second interconnect structures, wherein the stacked complementary transistor structure comprises a first transistor of a first type, and a second transistor of a second type which is opposite the first type, wherein the first transistor comprises a source element, and a drain element, and wherein the second transistor comprises a source element, and a drain element;
a first contact commonly connecting the drain elements of the first and second transistors to the first interconnect structure;
a second contact connecting the source element of the first transistor to the first interconnect structure;
a third contact connecting the source element of the second transistor to the second interconnect structure; and
an insulating layer disposed between the stacked complementary transistor structure and the second interconnect structure;
wherein the second and third contacts are disposed in alignment with each other; and
wherein the source element and the drain element of the second transistor each comprise an extended portion which extends beyond a gate of the second transistor into the insulating layer.

18. The device of claim 17, wherein the source element and the drain element of the second transistor comprise an epitaxial semiconductor material which is configured to apply a tensile strain on an active channel of the second transistor.

19. The device of claim 17, wherein the first and second transistors comprise gate-all-around field-effect transistors.

20. The device of claim 17, wherein the source element and the drain element of the second transistor comprise an epitaxial semiconductor material which is configured to apply a compressive strain on an active channel of the second transistor.

* * * * *